(12) United States Patent
Fournel et al.

(10) Patent No.: US 8,389,379 B2
(45) Date of Patent: *Mar. 5, 2013

(54) METHOD FOR MAKING A STRESSED STRUCTURE DESIGNED TO BE DISSOCIATED

(75) Inventors: Franck Fournel, Moirans (FR); Hubert Moriceau, Saint-Egreve (FR); Christelle Lagahe, Saint Joseph de Riviere (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/628,772

(22) Filed: Dec. 1, 2009

(65) Prior Publication Data
US 2010/0167499 A1    Jul. 1, 2010

Related U.S. Application Data

(62) Division of application No. 10/538,482, filed as application No. PCT/FR03/03622 on Dec. 8, 2003, now abandoned.

(30) Foreign Application Priority Data

Dec. 9, 2002   (FR) ..................... 02 15550

(51) Int. Cl.
*H01L 21/30* (2006.01)
(52) U.S. Cl. ............ 438/455; 257/226; 257/E27.155; 257/E21.122; 438/456; 438/457; 438/458
(58) Field of Classification Search .......... 438/455–459; 257/E21.122
See application file for complete search history.

(56) References Cited

U.S. PATENT DOCUMENTS

| | | |
|---|---|---|
| 3,901,423 A | 8/1975 | Hillberry et al. |
| 3,915,757 A | 10/1975 | Engel |
| 3,957,107 A | 5/1976 | Altoz et al. |
| 3,993,909 A | 11/1976 | Drews et al. |
| 4,006,340 A | 2/1977 | Gorinas |
| 4,028,149 A | 6/1977 | Deines et al. |
| 4,039,416 A | 8/1977 | White |
| 4,074,139 A | 2/1978 | Pankove |
| 4,107,350 A | 8/1978 | Berg et al. |
| 4,108,751 A | 8/1978 | King |
| 4,121,334 A | 10/1978 | Wallis |

(Continued)

FOREIGN PATENT DOCUMENTS

| | | |
|---|---|---|
| EP | 0 355 913 A1 | 2/1990 |
| EP | 0 383 391 A1 | 8/1990 |

(Continued)

OTHER PUBLICATIONS

Agarwal et al, "Efficient Production of Silicon-On-Insulator Films by Co-Implantation of HE+ with H+", *Applied Physics Letters*, vol. 72, No. 9, 1998, pp. 1086-1088.

(Continued)

*Primary Examiner* — Eugene Lee
*Assistant Examiner* — Elias M Ullah
(74) *Attorney, Agent, or Firm* — Brinks Hofer Gilson & Lione

(57) ABSTRACT

A method of making a complex microelectronic structure by assembling two substrates through two respective linking surfaces, the structure being designed to be dissociated at a separation zone. Prior to assembly, in producing a state difference in the tangential stresses between the two surfaces to be assembled, the state difference is selected so as to produce in the assembled structure a predetermined stress state at the time of dissociation.

26 Claims, 4 Drawing Sheets

U.S. PATENT DOCUMENTS

| | | | |
|---|---|---|---|
| 4,170,662 A | 10/1979 | Weiss et al. | |
| 4,179,324 A | 12/1979 | Kirkpatrick | |
| 4,244,348 A | 1/1981 | Wilkes | |
| 4,252,837 A | 2/1981 | Auton | |
| 4,254,590 A | 3/1981 | Eisele et al. | |
| 4,274,004 A | 6/1981 | Kanai | |
| 4,342,631 A | 8/1982 | White et al. | |
| 4,346,123 A | 8/1982 | Kaufmann | |
| 4,361,600 A | 11/1982 | Brown | |
| 4,368,083 A | 1/1983 | Bruel et al. | |
| 4,412,868 A | 11/1983 | Brown et al. | |
| 4,452,644 A | 6/1984 | Bruel et al. | |
| 4,468,309 A | 8/1984 | White | |
| 4,471,003 A | 9/1984 | Cann | |
| 4,486,247 A | 12/1984 | Ecer et al. | |
| 4,490,190 A | 12/1984 | Speri | |
| 4,500,563 A | 2/1985 | Ellenberger et al. | |
| 4,508,056 A | 4/1985 | Bruel et al. | |
| 4,536,657 A | 8/1985 | Bruel | |
| 4,539,050 A | 9/1985 | Kramler et al. | |
| 4,542,863 A | 9/1985 | Larson | |
| 4,566,403 A | 1/1986 | Fournier | |
| 4,567,505 A | 1/1986 | Pease | |
| 4,568,563 A | 2/1986 | Jackson et al. | |
| 4,585,945 A | 4/1986 | Bruel et al. | |
| 4,630,093 A | 12/1986 | Yamaguchi et al. | |
| 4,684,535 A | 8/1987 | Heinecke et al. | |
| 4,704,302 A | 11/1987 | Bruel et al. | |
| 4,717,683 A | 1/1988 | Parrillo et al. | |
| 4,764,394 A | 8/1988 | Conrad | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,887,005 A | 12/1989 | Rough et al. | |
| 4,891,329 A | 1/1990 | Reisman et al. | |
| 4,894,709 A | 1/1990 | Phillips et al. | |
| 4,904,610 A | 2/1990 | Shyr | |
| 4,920,396 A | 4/1990 | Shinohara et al. | |
| 4,929,566 A | 5/1990 | Beitman | |
| 4,931,405 A | 6/1990 | Kamijo et al. | |
| 4,948,458 A | 8/1990 | Ogle | |
| 4,952,273 A | 8/1990 | Popov | |
| 4,956,698 A | 9/1990 | Wang | |
| 4,960,073 A | 10/1990 | Suzuki et al. | |
| 4,975,126 A | 12/1990 | Margail et al. | |
| 4,982,090 A | 1/1991 | Wittmaack | |
| 4,996,077 A | 2/1991 | Moslehi et al. | |
| 5,013,681 A | 5/1991 | Godbey et al. | |
| 5,015,353 A | 5/1991 | Hubler et al. | |
| 5,034,343 A | 7/1991 | Rouse et al. | |
| 5,036,023 A | 7/1991 | Dautremont-Smith et al. | |
| 5,110,748 A | 5/1992 | Sarma | |
| 5,120,666 A | 6/1992 | Gotou | |
| 5,138,422 A | 8/1992 | Fujii et al. | |
| 5,198,371 A | 3/1993 | Li | |
| 5,200,805 A | 4/1993 | Parsons et al. | |
| 5,232,870 A | 8/1993 | Ito et al. | |
| 5,234,535 A | 8/1993 | Beyer et al. | |
| 5,242,863 A | 9/1993 | Xiang-Zheng et al. | |
| 5,250,446 A | 10/1993 | Osawa et al. | |
| 5,256,581 A | 10/1993 | Foerstner et al. | |
| 5,259,247 A | 11/1993 | Bantien | |
| 5,300,788 A | 4/1994 | Fan et al. | |
| 5,310,446 A | 5/1994 | Konishi et al. | |
| 5,374,564 A | 12/1994 | Bruel | |
| 5,400,458 A | 3/1995 | Rambosek | |
| 5,405,802 A | 4/1995 | Yamagata et al. | |
| 5,413,951 A | 5/1995 | Ohori et al. | |
| 5,442,205 A | 8/1995 | Brasen et al. | |
| 5,494,835 A | 2/1996 | Bruel | |
| 5,524,339 A | 6/1996 | Gorowitz et al. | |
| 5,539,241 A | 7/1996 | Abidi et al. | |
| 5,559,043 A | 9/1996 | Bruel | |
| 5,567,654 A | 10/1996 | Beilstein, Jr. et al. | |
| 5,611,316 A | 3/1997 | Oshima et al. | |
| 5,618,739 A | 4/1997 | Takahashi et al. | |
| 5,622,896 A | 4/1997 | Knotter et al. | |
| 5,633,174 A | 5/1997 | Li | |
| 5,661,333 A | 8/1997 | Bruel et al. | |
| 5,714,395 A | 2/1998 | Bruel | |
| 5,741,733 A | 4/1998 | Bertagnolli et al. | |
| 5,753,038 A | 5/1998 | Vichr et al. | |
| 5,804,086 A | 9/1998 | Bruel | |
| 5,811,348 A | 9/1998 | Matsushita et al. | |
| 5,817,368 A | 10/1998 | Hashimoto | |
| 5,854,123 A | 12/1998 | Sato et al. | |
| 5,863,830 A | 1/1999 | Bruel et al. | |
| 5,863,832 A | 1/1999 | Doyle et al. | |
| 5,877,070 A | 3/1999 | Goesele et al. | |
| 5,880,010 A | 3/1999 | Davidson | |
| 5,882,987 A | 3/1999 | Srikrishnan | |
| 5,897,331 A | 4/1999 | Sopori | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,981,400 A | 11/1999 | Lo | |
| 5,985,412 A | 11/1999 | Gösele | |
| 5,993,677 A | 11/1999 | Biasse et al. | |
| 5,994,207 A | 11/1999 | Henley et al. | |
| 6,010,591 A | 1/2000 | Gösele | |
| 6,013,563 A | 1/2000 | Henley et al. | |
| 6,013,954 A | 1/2000 | Hamajima | |
| 6,020,252 A | 2/2000 | Aspar et al. | |
| 6,033,974 A | 3/2000 | Henley et al. | |
| 6,048,411 A | 4/2000 | Henley et al. | |
| 6,054,363 A | 4/2000 | Sakaguchi et al. | |
| 6,054,370 A | 4/2000 | Doyle | |
| 6,057,212 A | 5/2000 | Chan et al. | |
| 6,071,795 A | 6/2000 | Cheung et al. | |
| 6,080,640 A | 6/2000 | Gardner et al. | |
| 6,096,433 A | 8/2000 | Kikuchi et al. | |
| 6,103,597 A | 8/2000 | Aspar et al. | |
| 6,103,599 A | 8/2000 | Henley et al. | |
| 6,118,181 A | 9/2000 | Merchant et al. | |
| 6,127,199 A | 10/2000 | Inoue | |
| 6,146,979 A | 11/2000 | Henley et al. | |
| 6,150,239 A | 11/2000 | Goesele et al. | |
| 6,156,215 A | 12/2000 | Shimada et al. | |
| 6,159,323 A | 12/2000 | Joly et al. | |
| 6,190,998 B1 | 2/2001 | Bruel et al. | |
| 6,197,695 B1 | 3/2001 | Joly et al. | |
| 6,198,159 B1 | 3/2001 | Hosoma et al. | |
| 6,200,878 B1 | 3/2001 | Yamagata et al. | |
| 6,204,079 B1 | 3/2001 | Aspar et al. | |
| 6,225,190 B1 | 5/2001 | Bruel et al. | |
| 6,225,192 B1 | 5/2001 | Aspar et al. | |
| 6,251,754 B1 | 6/2001 | Ohshima et al. | |
| 6,271,101 B1 | 8/2001 | Fukunaga | |
| 6,276,345 B1 | 8/2001 | Nelson et al. | |
| 6,287,940 B1 | 9/2001 | Cole et al. | |
| 6,294,478 B1 * | 9/2001 | Sakaguchi et al. | 438/753 |
| 6,303,468 B1 | 10/2001 | Aspar et al. | |
| 6,306,720 B1 | 10/2001 | Ding | |
| 6,310,387 B1 | 10/2001 | Seefeldt et al. | |
| 6,316,333 B1 | 11/2001 | Bruel et al. | |
| 6,323,108 B1 | 11/2001 | Kub et al. | |
| 6,323,109 B1 | 11/2001 | Okonogi | |
| 6,346,458 B1 | 2/2002 | Bower | |
| 6,362,077 B1 | 3/2002 | Aspar et al. | |
| 6,362,082 B1 | 3/2002 | Doyle et al. | |
| 6,407,929 B1 | 6/2002 | Hale et al. | |
| 6,417,075 B1 | 7/2002 | Haberger et al. | |
| 6,429,094 B1 | 8/2002 | Maleville et al. | |
| 6,429,104 B1 | 8/2002 | Auberton-Herve | |
| 6,465,892 B1 | 10/2002 | Suga | |
| 6,514,835 B1 * | 2/2003 | Hendrix et al. | 438/457 |
| 6,756,285 B1 * | 6/2004 | Moriceau et al. | 438/455 |
| 6,809,009 B2 | 10/2004 | Aspar et al. | |
| 7,067,396 B2 | 6/2006 | Aspar et al. | |
| RE39,484 E | 2/2007 | Bruel | |
| 7,494,897 B2 | 2/2009 | Fournel et al. | |
| 7,498,234 B2 | 3/2009 | Aspar et al. | |
| 7,615,463 B2 | 11/2009 | Aspar et al. | |
| 7,670,930 B2 | 3/2010 | Tauzin et al. | |
| 7,713,369 B2 | 5/2010 | Aspar et al. | |

| | | | |
|---|---|---|---|
| 7,772,087 B2 | 8/2010 | Nguyen et al. | |
| 7,883,994 B2 | 2/2011 | Moriceau et al. | |
| 7,902,038 B2 | 3/2011 | Aspar et al. | |
| 2006/0252229 A1 | 11/2006 | Joly et al. | |
| 2006/0281212 A1 | 12/2006 | Moriceau et al. | |
| 2007/0037363 A1 | 2/2007 | Aspar et al. | |
| 2007/0281445 A1 | 12/2007 | Nguyen et al. | |
| 2008/0254591 A1 | 10/2008 | Deguet et al. | |
| 2009/0120568 A1 | 5/2009 | Deguet et al. | |
| 2009/0130392 A1 | 5/2009 | Aspar et al. | |
| 2009/0156016 A1 | 6/2009 | Di Cioccio | |
| 2010/0025228 A1 | 2/2010 | Tauzin et al. | |
| 2010/0216294 A1 | 8/2010 | Rabarot et al. | |
| 2010/0323497 A1 | 12/2010 | Fournel | |

FOREIGN PATENT DOCUMENTS

| | | |
|---|---|---|
| EP | 0 410 679 A1 | 1/1991 |
| EP | 0 504 714 A2 | 9/1992 |
| EP | 0 533 551 A1 | 3/1993 |
| EP | 0 293 049 B1 | 9/1993 |
| EP | 0 660 140 A1 | 6/1995 |
| EP | 0 665 588 A1 | 8/1995 |
| EP | 0 703 609 A1 | 3/1996 |
| EP | 0 754 953 B1 | 1/1997 |
| EP | 0 793 263 A2 | 9/1997 |
| EP | 0 801 419 A1 | 10/1997 |
| EP | 0 807 970 A1 | 11/1997 |
| EP | 0 849 788 A2 | 6/1998 |
| EP | 0 889 509 A2 | 1/1999 |
| EP | 0 895 282 A2 | 2/1999 |
| EP | 0 898 307 A1 | 2/1999 |
| EP | 0 917 193 A1 | 5/1999 |
| EP | 0 938 129 A1 | 8/1999 |
| EP | 0 902 843 B1 | 3/2000 |
| EP | 0 989 593 A2 | 3/2000 |
| EP | 0 994 503 A1 | 4/2000 |
| EP | 1 050 901 A2 | 11/2000 |
| EP | 1 059 663 A2 | 12/2000 |
| EP | 1 096 259 A1 | 5/2001 |
| EP | 0 717 437 B1 | 4/2002 |
| FR | 2 558 263 A1 | 7/1985 |
| FR | 2 681 472 A1 | 3/1993 |
| FR | 2 725 074 A1 | 3/1996 |
| FR | 95 08882 | 6/1996 |
| FR | 2 736 934 A1 | 1/1997 |
| FR | 2 748 850 A1 | 11/1997 |
| FR | 2 748 851 A1 | 11/1997 |
| FR | 2 758 907 A1 | 7/1998 |
| FR | 2 767 416 A1 | 2/1999 |
| FR | 2 767 604 A1 | 2/1999 |
| FR | 2 771 852 A1 | 6/1999 |
| FR | 2 773 261 A1 | 7/1999 |
| FR | 2 774 510 A1 | 8/1999 |
| FR | 2 781 925 A1 | 2/2000 |
| FR | 2 789 518 A1 | 8/2000 |
| FR | 2 796 491 A1 | 1/2001 |
| FR | 2 797 347 A1 | 2/2001 |
| FR | 2 809 867 A1 | 12/2001 |
| FR | 2 819 099 A1 | 7/2002 |
| GB | 2 211 991 A | 7/1989 |
| JP | 53-104156 A | 9/1978 |
| JP | 58-031519 A | 2/1983 |
| JP | 59-054217 A | 3/1984 |
| JP | 61-129872 A | 6/1986 |
| JP | 62-265717 A | 11/1987 |
| JP | 101004013 | 1/1989 |
| JP | 01-128570 A | 5/1989 |
| JP | 01-169917 A | 7/1989 |
| JP | 08-017777 A | 1/1990 |
| JP | 04-199504 A | 7/1992 |
| JP | 07-254690 A | 10/1995 |
| JP | 07-302889 A | 11/1995 |
| JP | 08-133878 A | 5/1996 |
| JP | 09-213594 A | 8/1997 |
| JP | 09-307719 A | 11/1997 |
| JP | 10-163166 A | 6/1998 |
| JP | 10-233352 A | 9/1998 |
| JP | 11-045862 A | 2/1999 |
| JP | 11-074208 A | 3/1999 |
| JP | 11-087668 A | 3/1999 |
| JP | 11-145436 A | 5/1999 |
| JP | 11-233449 A | 8/1999 |
| JP | 11-317577 A | 11/1999 |
| RU | 128757 A1 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |
| WO | WO 02/05344 A1 | 1/2002 |
| WO | WO 02/47156 A1 | 6/2002 |
| WO | WO 02/083387 A1 | 10/2002 |
| WO | WO 02/084721 A1 | 10/2002 |
| WO | WO 02/084722 A1 | 10/2002 |
| WO | WO 03/032384 A1 | 4/2003 |
| WO | WO 2004/044976 A1 | 5/2004 |
| WO | WO 2004/059711 A1 | 7/2004 |
| WO | WO 2004/064146 A1 | 7/2004 |
| WO | WO 2005/000733 A2 | 1/2005 |
| WO | WO 2005/019094 A1 | 3/2005 |
| WO | WO 2005/043615 A1 | 5/2005 |
| WO | WO 2007/020351 A1 | 2/2007 |
| WO | WO 2007/036631 A1 | 4/2007 |
| WO | WO 2007/110515 A2 | 10/2007 |
| WO | WO 2008/093008 A2 | 8/2008 |
| WO | WO 2009/087290 A1 | 7/2009 |

OTHER PUBLICATIONS

Agarwal, Aditya et al. "Efficient Production of Silicon-On-Insulator Films by Co-Implantation of He+ with H+"—Proceedings 1997 IEEE International SOI Conference, Oct. 1997—pp. 44-45.

Ahn, K. Y., et al., "Growth, Shrinkage, and Stability of Interfacial Oxide Layers Between Directly Bonded Silicon Wafers", *Applied Physics A.*, vol. 50, 1990, pp. 85-94.

Alley et al., "Surface Roughness Modification of Interfacial Contacts in Polysilicon Microstructures", Proceedings of the 7th International Conference on Solid-State Sensors and Actuators, *Transducers '93*, Pacifico, Yokohama Japan. Jun. 7-10, 1993, pp. 288-291.

Almedia et al. "Bond formation in ion beam synthesized amorphous gallium nitride", *Elsevier, This Solid Films*, 343-344 1999, pp. 632-636.

Ascheron, C., "A Comparative Study of Swelling, Radiation, Strain and Radiation Damage of High-Energy Proton-bombarded GaAs, GaP, InP, Sl and Ge Single Crystals, Nuclear Instruments and Methods in Physics Research", *Nuclear Instruments and Methods in Physics Research* B36, (1989), 163-172.

Ascheron, C., "A Study of Proton Bombardment Induced Swelling of GaP Single Crystals", *Phys. stat. sol.* (a) 92, (1985), pp. 169-176.

Ascheron, C., "Gettering a Copper in Proton-and Helium-Bombarded Buried Regions of Gallium Phosphide", *Phys. stat. sol.* (a), vol. 106, 1988, pp. 73-79.

Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp. 549-557.

Ascheron, C., "Proton Beam Modification of Selected AIIIBV Compounds", *Phys. stat. sol.* (a) 124, (1991), pp. 11.

Ascheron, C., "Swelling, Strain, and Radiation Damage of He+ Implanted GaP", *Phys. stat. sol.* (a) 96, 1986, pp. 555-562. (1986).

Asheron, C., "The Effect of Hydrogen Implantation Induced Stress on GaP Single Crystals", *Nuclear Instruments and Methods in Physics Research*, B28 (1987), pp. 350-359.

Aspar et al., "The Generic Nature of the Smart-Cut © Process for Thin-Film Transfer", *Journal of Electronic Materials*, vol. 30, No. 7, Mar. 2001, pp. 834-840.

Aspar et al., Smart-Cut®: The basic fabrication process for UNIBOND® SOI wafers, *SEMI* 1996, pp. 37-46.

Aspar et al., U.S. Appl. No. 09/777,516, also Pub. No. US 2001/0007789 A1 with allowed claims, Published Jul. 12, 2001.

Aspar, B. "Basic Mechanisms Involved in the Smart-Cut Process", 1997, pp. 223-240.

Aspar, B. et al, "Characterization of SOI substrates: Application to Recent SIMOX and UNIBOND Wafers," *Electrochemical Society Proceedings*, vol. 96-3, pp. 99-111.

Aspar, B. et al, "Transfer of Structured and Patterned Thin Silicon Films Using the Smart-Cut Process", 1996, pp. 1985-1986.

Aspar, B. Et al., "Ultra Thin Buried Oxide Layers Formed by Low Dose SIMOX Processes", Proc. 6$^{th}$ International Conference on SOI Technology and Devices, *Electro. Soc.*, vol. 94, No. 11, 1994, pp. 62.

Aspar, B. et al., "Smart Cut—Process Using Metallic Bonding: Application to Transfer of Si, GaAs, InP Thin Films", Electronic Letters—Jun. 10, 1999, vol. 35, No. 12., pp. 1024-1025.

Auberton-Herve, A. J. et al, "A New Sal Material: Smart-Cut", 1996, pp. 214-219.

Auberton-Herve, A.J. et al, "SOI Materials for ULSI Applications", *Semiconductor International*, Oct. 1995, 5 pps.

A. J. Auberton-Hervé, "Why Can Smart Cut® Change the Future of Microelectronics?," Published in International Journal of High Speed Electronics and Systems, vol. 10, No. 1 (2000) pp. 131-146.

Ayguavives et al., "Physical Properties of (Ba,Sr) TiO$_3$ Thin Films Used for Integrated Capacitors in Microwave Applications", IEEE 2001.

Blöchl P.E. et al., First-Principles Calculations of Diffusion Coefficients: Hydrogen in Silicon, *Physical Review Letters*, vol. 64, No. 12, 1990, pp. 1401-1404.

Borgati, Stephen P., "The Root-Mean-Square", Boston College, Nov. 16, 1998, Obtained from the Internet at: <http://www.analytictech.com/mb313/rootmean.htm>.

Bruel, M. et al., (vol. 99-1) Meeting Abstract No. 333, "Single Crystal Semiconductor Layer Delamination and Transfer Through Hydrogen Implantation", The 195$^{th}$ Meeting of the Electrochemical Society, May 2-6, 1999, Seattle, Washington.

Bruel, Michel, "Application of Hydrogen Ion Beams to Silicon on Insulator Material Technology", *Nuclear Instruments and Methods in Physics Research*, B108, 1996, pp. 313-319.

Bruel, M. et al., "Smart-Cut: A New Silicon on Insulator Material Technology Based on Hydrogen Implantation and Wafer Bonding", 1997, pp. 1636-164, col. 36, Part 1, No. 3B.

Bruel, M. "Smart-Cut Process: The Way to Unibond S.O.I. Wafers", 1996, pp. unknown.

Bruel, M. et al, "Smart-Cut": A Promising New SOI material technology, *Proceedings 1994 IEEE, International Sal Conference*, Oct. 1995, pp. 178-179.

Bruel, M. et al, "Smart-Cut—A new SOI Material Technology based on hydrogen Implantation and wafer bonding," *CEA*, 1996, 24 pages.

Bruel, M., "Silicon on insulator Material Technology", *Electronic Letters*; 31 (1995) Jul. 6; No. 14; pp. 1201-1202.

Bruel, M., "Silicon-an-Insulator", *European Semiconductor*, Mar. 1997.

Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.

Canham et al. "Radiative Recombination Channels due to Hydrogen in Crystalline Silicon", *Materials Science and Engineering*, B4 (1989) pp. 41-45.

Carter et al., "Applications of Ion Beams to Materials", *Inst. Phys. Conf. Ser.*, No. 28, Chapter 1, 1976, pp. 30-36.

Carter, G. et al., The Collection of Ions Implanted in Semiconductors: II Range Distributions Derived From Collection and Sputter-Etch Curves, *Radiation Effects*, 1972, vol. 16, pp. 107-114.

Cassidy, Victor M., "Ion Implantation Process Toughens Metalworking Tools," *Modern Metals*, 1984, pp. 65-67.

Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.

Cerofini et al., "Ultradense Gas Bubbles in Hydrogen-or-Helium-Implanted (or Co-Implanted) Silicon", *Materials Science and Engineering*, B71, 2000, pp. 196-202.

Cerofolini et al., "Hydrogen and Helium Bubbles in Silicon", *Material Science and Engineering 2000*—Reports: A Review Journal, Published by Elsevier Science S.A. 2000, pp. 1-52.

Chu et al, "Radiation Damage of 50-250 keV Hydrogen Ions in Silicon", *Ion Implantation in Semiconductors*, eds. F. Chernob et al., Plenum New York 1976, pp. 483-492.

Chu, et al. "Ion Implantation in Semiconductors", Chernow, Borders and Brice, Pirnum Press, New York and London. Radiation Damage of 50-250 keV Hydrogen Ions in Silicon, 1976, pp. 483-491.

Chu, P.K. et al., "Plasma Immersion Ion Implantation—A Fledgling Technique for Semiconductor Processing", Materials Science and Engineering Reports, *A Review Journal*, vol. R17, Nos. 6-7, Nov. 30, 1996, pp. 207-280.

Cowern, N. et al., "Transport Diffusion of Ion-Implanted B in Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon,"*J. Appl. Phys.*, 49(10), Oct. 1978, pp. 5188-5198.

Demeester, et al., "Epitaxial Lift-Off and Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

Di Cioccio, L. et al., "*Silicon Carbide on Insulator Formation by the Smart Cut® Process*".—Materials Science and Engineering B46 (1997)—(pp. 349-356).

DiCioccio, et al.,"Silicon carbide on Insulator formation using the Smart Cut process", *Electronics Letters*, vol. 32, No. 12, Jun. 6, 1996, pp. 144-145.

Diem et al., "SOI 'SIMOX': From Bulk to Surface Micromachining, A New Age for Silicon Sensors and Actuators", *Sensors and Actuators*, vol. A 46-47, 1995, pp. 8-16.

Dirks, A. G. et al., "Columnar Microstructure in Vapor DEuropesited Thin Films ", *Thin Solid Films*, vol. 47, 1977, pp. 219-233.

Donohue et al., "Pulse-Extended Excimer Laser Annealing of Lead Zirconate Titanate Thin Films", Proceedings of the 12$^{th}$ International Symposium on Integrated Ferroelectrics, Aachen, Germany, Mar. 2000, *Integrated Ferroelectics*, vol. 31, pp. 285 to 296, 2000.

Duo, et al., "Comparison Between the different Implantation orders in H+ and He+ Co-implantation", *J. Phys. D. Appl. Phys.* vol. 34, 2001, pp. 477-482.

Duo, et al., "Evolution of Hydrogen and Helium Co-Implanted Single-Crystal Silicon During Annealing", 2001 American Institute Physics—Journal of Applied Physics, vol. 90, No. 8, Oct. 15, 2001, pp. 3780-3786.

Eaglesham, White, Feldman, Moriya and Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress in Surface Deformation of He-Implanted Surfaces" *Journal of Applied Physics*, vol. 48, No. 1, Jan. 1977, pp. 9-17.

Evans, J.H., "An Interbubble Fracture Mechanism of Blister Formation on Helium-Irradiated Metals" *Journal of Nuclear Materials*, 68, 1977, pp. 129-140.

Feijoo, et al., "Prestressing of Bonded Wafers"—*Proceedings of the First International Symposium on: Semiconductor Wafer Bonding: Science, Technology, and Applications—Electronics and Dielectric Science and Technology Divisions—Proceedings* vol. 92-7—Copyright 1992 by The Electrochemical Society, Inc., (pp. 228-238).

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Fujitsuka et al., "A New processing Technique to Prevent Stiction Using Silicon Selective Etching for SOT-MEMS", *Sensors and Actuators*, A97-98, Apr. 2002, pp. 716-719.

Garnier, D. M., "The Fabrication of a Partial Soi Substrate", Proceedings of the 9th International Symposium on Silicon on Isolator Technology and Devices, vol. 99, Chap. 54, 1990, 73-78.
Gerasimenko, N., "Infrared Absorption of Silicon Irradiated by Protons", *Phys. stat.sol.* (b) 90, (1978), pp. 689-695.
Ghandi, Sorab, "VLSI Fabrication Princiles—Silicon and Gallium Arsenide", *Rensselaer Polytechnic Institute*, 1983, John Wiley & Sons publishers, pp. 135.
Goesele et al., "Semiconductor Wafer Bonding", Science and Technology, ECS Series, *Annual Review of Material Science*, vol. 28, New Jersey, 1999, pp. 215-241.
Greenwald, A.C., "Pulsed-electron-beam annealing of ion-implantation damage", *J. Appl. Phys.* 50(2), Feb. 1978, pp. 783-786.
Grovenor, C.R.M., *Microelectronic Materials*, pp. 73-75 (1989).
Guilhalmenc, C. et al, "Characterization by Atomic Force Microscopy of the SOI Layer Topography in Low Dose SIMOX Materials", *Materials Science and Engineering*, B46, 1997, pp. 29-32.
Haisma et al., Silicon-on-Insulator Wafer Bonding-Wafer Thinning Technological Evaluations, *JAPANese Journal of Applied Physics*, Aug. 28, 1989, No. 8, Part 1, Tokyo, Japan, pp. 1426-1443.
Hamaguchi et al., "Device Layer Transfer Technique using Chemi-Mechanical Polishing", *JAPANese Journal of Applied Physics*, Oct. 23, 1984, No. 10, Part 2, Tokyo, Japan, pp. L815-L817.
Hamaguchi et al., "Novel LSI/SOI Wafer Fabrication Using Device Layer Transfer Technique", *Proc. IEDM*, 1985, pp. 688-691.
Heistand et al., "Advances in Passive Integration for C/RC Arrays & Networks with Novel Thin & Thick Film Materials", 36th Nordic IMAPS Conference, Helsinki, 1999.
Hendrix et al., "Low-Temperature Process for High-Density Thin-Film Integrated Capacitors", International Conference on High-Density Interconnect and Systems Packaging, 2000.
Henttinen et al., "Mechanically Induced Si Layer Transfer if Hydrogen-Implanted Si-Wafers", *American Institute of Physics*, vol. 76, No. 17, 2000, pp. 2370-2372.
Huang, et al., Calculation of critical layer thickness considering thermal strain in $Si_{1-x}Ge_x$/Si strained-layer heterostructures, J. Appl. Phys. 83 (1), Jan. 1, 1998.
Hulett, D.M. et al., "Ion Nitriding and Ion Implantation: A Comparison," *Metal Progress*, 1985, pp. 18-21.
IBM Technical Disclosure Bulletin, *Isolation by Inert Ion Implantation*, 1986, vol. 29 No. 3, pp. 1416.
IBM Technical Disclosure Bulletin, *SOI Interposer Structure XP 000627972*, Jul. 1996, vol. 39 No. 7, pp. 1-5.
Jalaguier, E. et al., "*Transfer of Thin InP Films Onto Silicon Substrate by Proton Implantation Process*".—11th International Conference on Indium Phosphide and Related Materials May 16-20, 1999—Davos, Switzerland. (pp. 26-27).
Jalaguier, E. et al., "*Transfer of 3in GaAs Film on Silicon Substrate by Proton Implantation Process*". Feb. 1998, pp. 408-409.
Jaussaud, C. et al., Microstructure of Silicon Implanted With High Dose Oxygen Ions, *Appl. Phys. Lett.*, vol. 48, No. 11, 1985, pp. 1064-1066.
Jenei et al., "High-Q Inductors and Capacitors on Si Substrate", IEEE 2001.
Johnson, "High Fluence Deuteron Bombardment of Silicon", *Radiation Effects*, 1977, vol. 32, pp. 159-167.
Jones, K. S. et al., "A Systematic Analysis of Defects in Ion Implanted Silicon", *Applied Physics A.*, vol. 45, 1988 pp. 1-34.
Jones et al., "Enhanced elimination of implantation damage upon exceeding the solid solubility", *J. App. Phys.*, vol. 62, No. 10, 1987, pp. 4114-4117.
Kamada et al, Observation of Blistering and Amorphization on Germanium Surface After 450 keV Ar+ION Bombardment, *Radiation Effects*, vol. 28, 1976, pp. 43-48.
Kim et al., "A Porous-Si-based Novel Isolation Technology for Mixed-Signal Integrated Circuits", Symposium on VLSI Technology, 2000.
Klem, J.F., "Characteristics of Lift-Off Fabricated AlGaAs/InGaAs Single-Strained-Quantum Well Structures on Glass and Silicon Substrates", *Inst. Phys. Conf.* Ser. No. 96: Chapter 6, (1989), pp. 387-392.
Komarov et al., Crystallographic Nature and Formation Mechanisms of Highly Irregular Structure in Implanted and Annealed S1, Layers*Radiation Effects*, vol. 42, 1979, pp. 169-178.

Kucheyev et al., "Ion Implantation Into GaN", *Materials Science and Engineering*, vol. 33, 2001, pp. 51-107.
Laporte A. et al., "Charged Defects at the Interface Between Directly Bonded Silicon Wafers"—Applied Physics, vol. 36 (Sep. 1997) pp. 5502-5506—Part 1, No. 9A.
Li, J., "Novel Semiconductor Substrate Formed by Hydrogen Ion Implantation into Silicon," Appl. Phys. Lett., vol. 55, No. 21, Nov. 20, 1989, pp. 2223-2224.
Ligeon, E., "Hydrogen Implantation in Silicon Between 1.5 and 60 KeV", *Radiation Effects 1976*, vol. 27, pp. 129-137.
Liu et al., "Investigation of Interface in Silicon-On-Insulator by Fractual Analysis", *Applied Surface Science*, vol. 187, Feb. 28, 2002, pp. 187-191.
Liu et al. "Ion Implantation in GaN at Liquid-Nitoigen Temperature: Structural Characteristics and Amorphization", *Physical Review B of The American Physical Society*, vol. 57, No. 4, 1988, pp. 2530-2535.
Lu, X., et al., "SOI Material Technology Using Plasma Immersion ION Implantation", Proceedings 1996 IEEE International SOI Conference, Oct. 1996, pp. 48-49.
Liu et al., "Integrated Thin Film Capacitor Arrays", International Conference on High Density Packaging and MCMs, 1999.
Maleville, C. et al, "Physical Phenomena involved in the Smart-Cut Process", *Electrochemical Society Proceeding*, vol. 96-3, 1996—pp. 34-46.
Maleville, C. et al, "Wafer Bonding and Hi-Implantation Mechanisms Involved in the Smart-Cut Technology", 1997, pp. 14-19.
Manuaba, A., "Comparative Study on Fe32Ni36Cr14P12B 6 Metallic Glass and its Polycrystalline Modification bombarded by 2000 keV Helium Ions with High Fluence" *Nuclear Instruments and Methods*, (1982) pp. 409-419.
Mastrangelo, C. et al., "Suppression of Stiction in MEMS", *Proceedings of the Materials Research Society Seminar*, vol. 605, 2000, pp. 1-12.
Matsuda et al., "Large Diameter Ion Beam Implantation System," *Nuclear Instruments and Methods*, vol. B21, 1987, pp. 314-316.
Matsuo et al., "Abnormal solid solution and activation behavior in GA-implanted Si(100)", *Appl. Phys. Lett.*, vol. 51, No. 24, 1987, pp. 2037-2039.
Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.
Miyagawa, S. et al, "Helium Reemission During Implantation of Silicon Carbide", *J. Appl. Phys.*, 54 (5), May 1983, pp. 2302-2306.
Miyagawa, S., "Surface structure of silicon carbide Irradiated with helium ions with mono energy and continuous energy distributions" *J. Appl. Phys.* 53(12), Dec. 1982, pp. 8697-8705.
Monemar, B. "Shallow Impurities in Semiconductors 1998", Proceedings of the Third International Conference in Sweden, Aug. 10-12, 1988, No. 95, pp. 493-499.
Moreau, Wayne M., "Semiconductor Lithography, Principles, Practices, and Materials," Plenum Press, 1988. Table of Contents only.
Moriceau, H. et al, A New Characterization Process Used to Qualify SOI Films 1991 pp. 173-178.
Moriceau, H. et al, "A New Characterization Process Used to Qualify SOI Films", 1991 pp. 173-178.
Moriceau, H. et al. "Cleaning and Polishing as Key Steps for Smart-Cut SOI Process", Proceedings 1996 IEEE SOI Conference, Oct. 1996.
Moriceau, H. et al, "The Smart-Cut Process as a Way to Achieve Specific Film Thickness in Sal Structures", 1997, pp. unknown.
Moriceau et al., (vol. 99-1) Meeting Abstract No. 405, "A New Characterization Process Used to Qualify SOI Films", The 195th Meeting of the Electrochemical Society, May 2-6, 1999, Seattle, Washington.
Motohiro et al. "*Geometrical Factors of Argon Incorporation in $SiO_2$ Films Deposited by ION Beam Sputtering*"—Thin Solid Films, Elsevier-Sequoia S.A. Lausanne, CH, vol. 120, No. 4—Oct. 1, 1984, pp. 313-327.
Munteanu, D. et al, "Detailed Characterization of Unibond Material", 1997, pp. 395-398.
Myers, D. R., "The effects of Ion-Implantation damage on the first order Raman spectra GaPa)" *J. Appl. Phys.* 54(9), Sep. 1977.

Nethling. J. et al, "Identification of Hydrogen Platelets in ProtonBombarded GaAs", 1985, pp. 941-945.
Nichols C. S et al., "Properties of Hydrogen in Crystalline Silicon Under Compression and Tension", *Physical Review Letters*, vol. 63, No. 10, 1989, pp. 1090-1093.
Nicoletti, S. et al., "Bi-Epitaxial YBCO Grain Boundry Josephson Junctions on SrTiO3 and Sapphire Substrates", *Physics C269*, 1996, pp. 255-267.
Ono et al., "Orientation Dependence of Flaking of Ion Irradiated Aluminum Single Crystals", *Japanese Journal of Applied Physics*, vol. 25, No. 10, 1986, pp. 1475-1480.
Paszti, E, "Flaking and Wave-Like Structure on Metallic Glasses Induced by MeV-Energy Helium Ions", *Nuclear Instruments and Methods*, vol. 209/210, (1983), pp. 273-280.
Picraux, S. Thomas et al., "Ion Implantation of Surfaces," *Scientific American*, vol. 252, No. 3, pp. 102-113 1985.
Pollentier, et al., "Fabrication of High-Radiance LEDs by Epitaxial Lift-Off", *SPIE*, vol. 1361, 1990, pp. 1056-1062.
Popov, V.P. et al., "Blistering on a Silicon Surface in the Process of Sequential Hydrogen/Helium ION Co-Iplantation"—Optoelecironics Instrumentation and Data Processing, No. 3, Apr. 5, 2001—pp. 90-98—2001.
Primak, W., "Impurity Effect in the Ionization Dilation of Vitreous Silica" *J. Appl. Phys.* 39(13) 1968.
Ray et al. "*Effect of Reactive-Ion Bombardment on the Properties of Silicon Nitride and Oxynitride Films Deposited by Ion-Beam Sputtering*"—Journal of Applied Physics, vol. 75, No. 12, Jun. 15, 1994—pp. 8145-8152.
Renier, M. et al., "A New Low-Energy Ion Implanter for Bombardment of Cylindrical Surfaces," *Vacuum*, vol. 35, No. 12, pp. 577-578, 1985.
Roozeboom et al., "High-Value MOS Capacitor Arrays in Ultradeep Trenches in Silicon", *Microelectronic Engineering*, vol. 53, pp. 581 to 584, Elsevier Science 2000.
Roth, J., "Blistering and Bubble Formation" *Inst. Phys. Conf.* Ser. No. 28, 1976: Chapter 7, pp. 280-293.
Sah, Chih-Tang et al., "Deactivation of the Boron Acceptor in Silicon by Hydrogen," *Appl. Phys. Lett.* 43, (2), Jul. 1983, pp. 204-206.
Saint-Jacques R. G., "La Formation des Cloques", *Nuclear Instruments and Methods*, No. 209/210, North Holland Publishing Co., 1983, pp. 333-343.
Schnell et al., "Plasma Surface Texturization for Multicrystaline Silicon Solar Cells", *IEEE*, XXVIII, Photovoltaic Conference, 2000, pp. 367-370.
Shintani, A. et al., "Temperature dependence of stresses in chemical deposited vitreous films", *J. Appl. Phys.*, vol. 51, No. 8, 1980, pp. 4197.
Silicon-On-Insulator, *European Semiconductor*, Mar. 1997, pp. 17 and 18.
Sioshansi, Piran, "Ion Beam Modification of Materials for Industry," *Thin Solid Film*, vol. 118, 1984, pp. 61-71.
Snyman, H. C., "Transmission Electron Microscopy of Extended Crystal Defects in Proton Bombarded and Annealed GaAs", Radiation Effects, 1983, vol. 69, pp. 199-230.
Snyman, H. C. et al, "Void Formation in Annealed Proton-Bombarded GaAs", 1981, pp. 243-245.
Stein, Myers and Follstaedt, "Infrared Spectroscopy of chemically bonded hydrogen at voids and defects in silicon", *J. Appl. Phys.* 73(b6), Mar. 15, 1993, pp. 2755-2764.
Stephen, D., "Investigation of Lattice Strain in Proton-Irradiated GaP by a Modified Auleytner Technique" *Phys. stat. sol.* (a) 87, 1985, pp. 589-596.
Sunkara et al., "Bulk synthesis of silicon nanowires using a low-temperature vapor-liquid-solid solution", *Applied Physics Letters*, vol. 79, No. 10, Sep. 3, 2001, pp. 1546-1548.
Suzuki et al., "High-Speed and Low Power n+—p+ Double-Gate SOI CMOS", *IEICE Trans. Electron.*, vol. E78-C, No. 4, 1995, pp. 360-367.
Sze, S.M., VLSI Technology, 2.sup.nd Ed., 1988, pp. 9-10.
Tan, T. Y. et al., "On Oxygen Precipitation Retardation/Recovery Phenomena, Nucleation Incubation Phenomena and the Exigent-Accomodation-Volume Factor of Precipitation", Proceedings of the 5$^{th}$ International Symposium on Silicon Materials Science and Technology, *Semiconductor Silicon 198 Electrochem. Soc.*, New Jersey, 1986, pp. 864-873.
Terada, K. et al., "A New Dram Cell With a Transistor on a Lateral Epitaxial Silicon Layer (Tole Cell)", *IEEE Transactions on Electron Device*, vol. 37, No. 9, 1990, pp. 2052-2057.
Theodore, N. David et al., TFSOI With Improved Oxidation Resistance (To Reduce Isolation Induced Stresses and Leakage), Motorola Bulletin XP 000691920, *Technical Developments*, Nov. 1996, pp. 158-159.
Tillman et al., "Zero-Level Packaging for MEMS or MST Devices: The IRS Method", MEMS/Sensors, Advancing Microelectronics, pp. 37-39, Nov./Dec. 2000.
Timoshenko, S. et al., "Analysis of Bi-Metal Thermostats", *J. Opt. Soc. Am.*, vol. 11, 1925, pp. 233-256.
Tomisaka et al., "Electroplating Cu Fillings for Through-Vias for Three-Dimensional Chip Stacking" (Electronic Components and Technology Conference, Aug. 2002).
Tong et al., "Low Temperature SI Layer Splitting", Proceedings 1997 IEEE International SOI Conference, Oct. 1997, pp. 126-127.
Tonini, Monelli, Cornl, Ottaviani, Frabboni, Canteri, Queirolo, "Hydrogen Interaction with phosphorus ion implantated silicon", *Ion Implantation Technology—94*, (1995) pp. 801-804.
Tzeng, J.C., "A Novel Self-Aligned Oxgyen (Salox) Implanted SOI Mosfet Device Structure" *Nuclear Instruments and Methods in Physics Research* B2, 1987, pp. 112-115.
U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.
Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.
Van de Walle, C. "Theoretical Aspects of Hydrogen in Crystalline Semiconductors", *Physica B*, Holland, vol. 170, No. 15, 1991, pp. 21-32.
Van de Walle, C. "Theory of Hydrogen Diffusion and Reactions in Crystalline Silicon", *Physical Review Letters*, vol. 64, No. 6, 1980, pp. 669-672.
Van de Walle, C. "Theory of Hydrogen Diffusion and Reactions in Crystalline Silicon", *Physical Review B*, vol. 39, No. 15, 1989, pp. 10791-10808, plus diagrams.
Van Swijgenhoven et al. "Helium Bubble and Blister Formation for Nickel and a n AMorphous Fe-Ni-Mo-B Alloy During 5 kev He-+- Irradiation at Temperatures Between 200 K and 600", *Nuclear Instruments and Methods*, 209/210, 1983, pp. 461-468.
Veldkamp, W.B. et al., "Binary Optics," *Scientific American*, 1992, pp. 50-55.
Venezia et al., "The Role of Implantation Damage in the Production of Silicon-On-Insulator Films by Co-Implantation of He$^+$ and H$^{+}$", Electrochemical Society Proceedings vol. 98-1, 1998—pp. 1384-1395.
Weldon et al., "Mechanism of Silicon Exfoliation Induced by Hydrogen/Hekium Co-implantation", *Applied Physics Letters*, Vol, 73, No. 25, pp. 3721-3723, Dec. 21, 1998.
Wemple, S.H., "Optical and channeling studies of ion-bombarded GaP", *J. Appl. Phys.*, vol. 45, No. 4, Apr. 1974, pp. 1578-1588.
Whitton, J. L. et al., "The Collection of Ions Implanted in Semiconductors: 1 Saturations Effects", *Radiation Effects*, Scotland, vol. 16, 1972, pp. 101-105.
Wiegand, M. et al., "Wafer Bonding of Silicon Wafers Covered With Various Surface Layers", *Sensors and Actuators*, Elsevier Science B.V., vol. 86, 2000, pp. 91-95.
Williams J. et al., "Annealing behaviour of high-dose rare-gas implantations into silicon", from Application of Ion Beans to Materials, 1975, Chap. 1, *Inst. Phys. Conf. Ser. No. 28*, 1976, pp. 30-36.
Wittmaack et al., "High Fluence Retention of Noble Gases Implanted in Silicon" *Radiation Effects*, vol. 39, 1978, pp. 81-95.
Wolf, Stanley Ph.D., Silicon Processing for the VLSI Era (vol. 2), Lattice Press, 1990, pp. 66-79.

Wong et al., "Integration of GaN Thin Films With Dissimilar Substrate Materials by Pd—In Metal Bonding and Laser Lift-Off", Journal of Electronic Materials, vol. 28, No. 12, 1999, pp. 1409-1413.

Yamaguchi H. et al., "Intelligent Power IC With Partial SOI Structure", *Jpn. J. Appl. Phys.*, vol. 34, 1995, pp. 864-868.

Yee et al., "Polysilicon Surface-Modification Technique to Reduce Sticking of Microstructures", *Sensors and Actuators* A 52, 1996, pp. 145-150.

Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct. 1999, pp. 129-130.

Yun et al., "Thermal and Mechanical Separations of Silicon Layers From Hydrogen Pattern-Implanted Wafers", *Journal of Electronic Materials*, vol. 36, No. 8, Apr. 24, 2001, pp. 960-964.

Yun, H. et al., "Transfer of Patterned Ion-Cut Silicon Layers", *Applied Physics Letters*, vol. 73, No. 19, 1998, pp. 2772-2774.

International Search Report for International Application No. PCT/FR1998/002904, dated Apr. 16, 1999, 2 pages.

International Search Report for International Application No. PCT/FR2002/001266, dated Feb. 7, 2003, 4 pages.

International Search Report for International Application No. PCT/FR2002/001268, dated Feb. 6, 2003, 4 pages.

International Search Report for International Application No. PCT/FR2002/003422, dated Jan. 22, 2003, 3 pages.

International Search Report for International Application No. PCT/FR2003/003256, dated Mar. 19, 2004, 6 pages.

International Search Report for International Application No. PCT/FR2003/003867, dated May 28, 2004, 3 pages.

International Search Report for International Application No. PCT/FR2003/003622, dated Jun. 3, 2004, 3 pages.

International Search Report for International Application No. PCT/FR2004/001858, dated Dec. 28, 2004, 3 pages.

International Search Report for International Application No. PCT/FR2004/002779, dated Apr. 5, 2005, 3 pages.

International Search Report for International Application No. PCT/FR2004/002781, dated Apr. 5, 2005, 3 pages.

International Search Report for International Application No. PCT/FR2004/001565, dated Jul. 6, 2005, 3 pages.

International Search Report for International Application No. PCT/FR2006/001945, dated Jan. 8, 2007, 3 pages.

International Search Report for International Application No. PCT/FR2006/002184, dated Jan. 24, 2007, 2 pages.

International Search Report for International Application No. PCT/FR2007/000534, dated Nov. 22, 2007, 3 pages.

International Search Report for International Application No. PCT/FR2007/002100, dated Feb. 4, 2009, 3 pages.

International Search Report for International Application No. PCT/FR2008/001427, dated Jul. 1, 2009, 3 pages.

Office Action from U.S. Appl. No. 12/063,808, dated Apr. 6, 2010, 9 pages.

Office Action from U.S. Appl. No. 12/063,808, dated Sep. 22, 2010, 9 pages.

Advisory Action from U.S. Appl. No. 12/063,808, dated Jan. 21, 2011, 3 pages.

Office Action from U.S. Appl. No. 10/534,199, dated Feb. 19, 2009, 8 pages.

Office Action from U.S. Appl. No. 10/534,199, dated Aug. 5, 2009, 10 pages.

Office Action from U.S. Appl. No. 10/534,199, dated Jan. 20, 2010, 8 pages.

Office Action from U.S. Appl. No. 10/534,199, dated Aug. 4, 2010, 8 pages.

Office Action from U.S. Appl. No. 10/577,175, dated Jun. 22, 2009, 13 pages.

Office Action from U.S. Appl. No. 10/577,175, dated Apr. 13, 2010, 14 pages.

Office Action from U.S. Appl. No. 11/480,250, dated May 22, 2008, 10 pages.

Office Action from U.S. Appl. No. 11/480,250, dated Dec. 3, 2008, 16 pages.

Office Action from U.S. Appl. No. 11/480,250, dated Jan. 26, 2010, 14 pages.

Office Action from U.S. Appl. No. 11/480,250, dated Aug. 3, 2010, 15 pages.

Office Action from U.S. Appl. No. 12/088,047, dated Sep. 25, 2009, 9 pages.

Office Action from U.S. Appl. No. 12/088,047, dated Mar. 10, 2010, 9 pages.

Office Action from U.S. Appl. No. 10/561,299, dated Mar. 26, 2008, 9 pages.

Office Action from U.S. Appl. No. 10/561,299, dated Dec. 9, 2008, 11 pages.

Office Action from U.S. Appl. No. 10/561,299, dated May 11, 2009, 12 pages.

Office Action from U.S. Appl. No. 10/561,299, dated Nov. 16, 2009, 11 pages.

Office Action from U.S. Appl. No. 10/561,299, dated Nov. 27, 2009, 10 pages.

Office Action from U.S. Appl. No. 10/561,299, dated May 11, 2010, 11 pages.

Office Action from U.S. Appl. No. 10/565,621, dated May 15, 2007, 13 pages.

Office Action from U.S. Appl. No. 10/565,621, dated Feb. 11, 2008, 11 pages.

Office Action from U.S. Appl. No. 10/565,621, dated Sep. 12, 2008, 9 pages.

Office Action from U.S. Appl. No. 10/565,621, dated Mar. 12, 2009, 6 pages.

Office Action from U.S. Appl. No. 10/565,621, dated Jan. 7, 2010, 8 pages.

Office Action from U.S. Appl. No. 10/565,621, dated Nov. 23, 2010, 11 pages.

Notice of Allowance from U.S. Appl. No. 12/336,229, dated Sep. 29, 2010, 7 pages.

Notice of Allowance from U.S. Appl. No. 12/336,229, dated Jan. 10, 2011, 4 pages.

Office Action from U.S. Appl. No. 10/468,223, dated Oct. 5, 2005, 7 pages.

Office Action from U.S. Appl. No. 10/468,223, dated May 3, 2006, 11 pages.

Office Action from U.S. Appl. No. 10/468,223, dated Jan. 10, 2007, 11 pages.

Office Action from U.S. Appl. No. 10/468,223, dated Jul. 20, 2007, 11 pages.

Office Action from U.S. Appl. No. 10/468,223, dated Feb. 11, 2008, 11 pages.

Office Action from U.S. Appl. No. 10/468,223, dated Oct. 29, 2008, 11 pages.

Office Action from U.S. Appl. No. 10/468,223, dated Jun. 25, 2009, 8 pages.

Notice of Allowance from U.S. Appl. No. 10/468,223, dated Dec. 28, 2009, 4 pages.

Office Action from U.S. Appl. No. 10/474,984, dated Sep. 24, 2004, 6 pages.

Office Action from U.S. Appl. No. 10/474,984, dated Jun. 6, 2005, 5 pages.

Office Action from U.S. Appl. No. 10/474,984, dated Nov. 16, 2005, 5 pages.

Office Action from U.S. Appl. No. 10/474,984, dated May 17, 2006, 5 pages.

Office Action from U.S. Appl. No. 10/474,984, dated May 7, 2007, 9 pages.

Office Action from U.S. Appl. No. 10/474,984, dated Feb. 6, 2008, 10 pages.

Office Action from U.S. Appl. No. 10/474,984, dated Oct. 17, 2008, 11 pages.

Office Action from U.S. Appl. No. 10/474,984, dated Jul. 7, 2009, 10 pages.

Office Action from U.S. Appl. No. 10/474,984, dated Mar. 11, 2010, 13 pages.

Notice of Allowance from U.S. Appl. No. 10/474,984, dated Oct. 28, 2010, 6 pages.

Office Action from U.S. Appl. No. 10/540,303, dated Dec. 18, 2007, 6 pages.

Notice of Allowance from U.S. Appl. No. 10/540,303, dated Oct. 7, 2008, 9 pages.
Office Action from U.S. Appl. No. 11/327,906, dated Oct. 1, 2007, 5 pages.
Office Action from U.S. Appl. No. 11/327,906, dated Feb. 11, 2008, 5 pages.
Notice of Allowance from U.S. Appl. No. 11/327,906, dated Sep. 15, 2008, 6 pages.
Office Action from U.S. Appl. No. 10/975,826, dated May 5, 2006, 14 pages.
Office Action from U.S. Appl. No. 10/975,826, dated Nov. 28, 2006, 20 pages.
Office Action from U.S. Appl. No. 10/975,826, dated Jul. 17, 2007, 21 pages.
Office Action from U.S. Appl. No. 10/975,826, dated Apr. 1, 2008, 27 pages.
Office Action from U.S. Appl. No. 10/975,826, dated Dec. 10, 2008, 28 pages.
Office Action from U.S. Appl. No. 10/975,826, dated Sep. 2, 2009, 24 pages.
Notice of Allowance from U.S. Appl. No. 10/975,826, dated Apr. 28, 2010, 8 pages.
Office Action from U.S. Appl. No. 10/492,343, dated Oct. 17, 2005, 6 pages.
Office Action from U.S. Appl. No. 10/492,343, dated Jun. 6, 2006, 13 pages.
Office Action from U.S. Appl. No. 10/492,343, dated Nov. 14, 2006, 13 pages.
Office Action from U.S. Appl. No. 10/492,343, dated May 29, 2007, 15 pages.
Office Action from U.S. Appl. No. 10/492,343, dated Feb. 7, 2008, 18 pages.
Office Action from U.S. Appl. No. 10/492,343, dated Aug. 18, 2008, 12 pages.
Office Action from U.S. Appl. No. 10/492,343, dated Dec. 22, 2008, 9 pages.
Notice of Allowance from U.S. Appl. No. 10/492,343, dated Jun. 26, 2009, 6 pages.
Office Action from U.S. Appl. No. 11/747,733, dated Mar. 16, 2009, 9 pages.
Office Action from U.S. Appl. No. 11/747,733, dated Mar. 23, 2010, 5 pages.
Notice of Allowance from U.S. Appl. No. 11/747,733, dated Sep. 29, 2010, 8 pages.
Notice of Allowance from U.S. Appl. No. 12/293,193, dated Oct. 8, 2009, 10 pages.
Expert Report of Marcus Weldon, Ph.D. dated Nov. 1, 2000.
Expert Report of Jean-Pierre Colinge dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities in Support of Soitec's Motion for Summary Judgment on Sigen's Enablement Invalidity Claim (Redacted) dated Mar. 27, 2001.
Soitec's Memorandum of Points and Authorities in Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.
Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Report of Jean-Pierre Colinge in Response to SiGen Enablement and Indefiniteness Expert Reports of Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment as a Matter of Law and a New Trial dated May 10, 2002.
Silicon Genesis Corporation's Opposition to Plaintiff's Motion for Judgment as a Matter of Law and a New Trial dated Jun. 17, 2002.
Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross-Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post-Trial Motions dated Aug. 23, 2002.
Judgment dated Oct. 21, 2002.
Brief of Plaintiffs—Appellants Soitec, S.A. and Commissariat a L'Energie Atomique dated Jan. 28, 2003.
Brief for Defendant—Cross Appellant Silicon Genesis Corporation dated Mar. 22, 2003.
Reply Brief of Plaintiffs—Appellants Soitec, S.A. and Commissariat a L'Energie Atomique dated May 5, 2003.
Reply Brief for Defendant—Cross Appellant Silicon Genesis Corporation dated May 19, 2003.
Plaintiff/Appellants Supplemental Authority Letter [dated Nov. 17, 2003].
Defendant—Cross Appellant's Response to Appellants' Submission of *CFMT, Inc.* v. *Yieldup Int'l* [dated Nov. 24, 2003].
Decision from the United States Court of Appeals for the Federal Circuit dated Nov. 26, 2003.
Combined Petition for Panel Rehearing and for Rehearing En Banc by Plaintiffs—Appellant's Soitec, S.A. and Commissariat a L'Energie Atomique, dated Dec. 10, 2003.
Order [dated Jan. 7, 2004 denying Appellants' petition for panel rehearing and Appellant's petition for rehearing en banc].
Judgment Mandate [dated Jan. 14, 2004].
Complaint filed with Jury Demand against MEMC Electronic Materials Inc.—Magistrate Consent Notice to Pltf. ( Filing fee $ 350, receipt No. 152004.)—filed by SOITEC Silicon on Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).

Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).

Motion to Dismiss Based upon Fed. R. Civ. P. 12(b)(1) and (6) and Article III of the United States Constitution—filed by SOITEC Silicon on Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).

Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).

Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon on Insulator Technologies SA, Commissariat a LEnergie Atomique. (Attachments: # 1 Certificate of Service)(Kraft, Denise) (Entered: Apr. 7, 2009) (18 pgs).

Answer to 32 Answer to Counterclaim,,, of S.O.I. TEC Silicon on Insulator Technologies, S.A. and SOITEC U.S.A., Inc. by MEMC Electronic Materials Inc. (Rogowski, Patricia) (Entered: Apr. 23, 2009) (4 pgs).

Notice of by SOITEC Silicon On Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).

Stipulation and [Proposed] Order to File an Amended Complaint by SOITEC Silicon On Insulator Technologies SA, Commissariat a LEnergie Atomique. (Attachments: # 1 Exhibit A, # 2 Certificate of Service)(Kraft, Denise) (Entered: Jul. 16, 2009).

Notice of Service of Soitec's Objections and Responses to MEMC's Second Request for Production of Documents and Things Directed to Soitec re 46 Notice of Service by SOITEC Silicon On Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).

First Amended Complaint for *Patent Infringement* against MEMC Electronic Materials Inc.—filed by SOITEC Silicon On Insulator Technologies SA, Commissariat a L'Energie Atomique. (Attachments: # 'I Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).

Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).

Answer to 60 Answer to Amended Complaint, Counterclaim,,, Counterclaim *Reply to Defendant's Amended Counterclaims, Counterclaims and Affirmative Defenses* against MEMC Electronic Materials Inc. by SOITEC Silicon On Insulator Technologies SA, Commissariat a L'Energie Atomique, SOITEC U.S.A., Inc.. (Attachments: # 1 Certificate of Service)(Kraft, Denise) (Entered: Aug. 31, 2009).

Notice of Service of MEMC's Third Set of Interrogatories Directed to S.O.I.TEC Silicon On Insulator Technologies, S.A., SOITEC USA, Inc., and Commissariat a L'Energie Atomique by MEMC Electronic Materials Inc. (Rogowski, Patricia) (Entered: Sep. 1, 2009).

Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).

Motion to Bifurcate *the Issues of Willfulness and Damages for Purposes of Discovery and Trial and proposed Form of Order*—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).

Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 'I Exhibit A, # 2 Exhibit B, # 3 Exhibit C)(Rogowski, Patricia) (Entered: Oct. 21, 2009).

Cross Motion to Bifurcate *all Collateral Issues*—filed by SOITEC Silicon on Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).

Answering Brief in Opposition re 85 Cross Motion to Bifurcate *all Collateral Issues*, 77 Motion to Bifurcate *the Issues of Willfulness and Damages for Purposes of Discovery and Trial and proposed Form of Order* filed by SOITEC Silicon on Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).

Reply Brief re 77 Motion to Bifurcate *the Issues of Willfulness and Damages for Purposes of Discovery and Trial and proposed Form of Order* filed by MEMC Electronic Materials Inc.. (Attachments: # 1 Exhibit 1, # 2 Exhibit 2, # 3 Exhibit 3)(Rogowski, Patricia) (Entered: Nov. 17, 2009).

Answering Brief in Opposition re 85 Cross Motion to Bifurcate *all Collateral Issues* filed by MEMC Electronic Materials Inc..Reply Brief due date per Local Rules is Dec. 3, 2009. (Rogowski, Patricia) (Entered: Nov. 19, 2009).

Reply Brief re 85 Cross Motion to Bifurcate *all Collateral Issues* filed by Commissariat a LEnergie Atomique, Soitec Silicon on Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).

Notice of Service of S.O.I.TEC Silicon On Insulator Technologies, S.A. and Commissariat a L'Energie Atomique's Production of Three Boxes of Wafer Samples by Commissariat a LEnergie Atomique, SOITEC Silicon On Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).

Motion for Leave to File *Stipulated Motion for Leave to File a Sur-Reply Brief in Support of MEMC's Motion to Bifurcate*—filed by MEMC Electronic Materials Inc.. (Attachments: # 1 Exhibit 1)(Rogowski, Patricia) (Entered: Dec. 14, 2009).

Sur-Reply Brief re 77 Motion to Bifurcate *the Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial* filed by MEMC Electronic Materials Inc.. (Rogowski, Patricia) (Entered: Dec. 16, 2009).

Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).

Opening Brief in Support re 141 Motion for Discovery *Motion for the Admission of the Expert Testimony of John T. Goolkasian Relating to the Certificate of Correction for U.S. Patent No. 7,067,396* filed by MEMC Electronic Materials Inc..Answering Brief/Response due date per Local Rules is May 24, 2010. (Attachments: # 1 Exhibit 1, # 2 Exhibit 2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered: May 7, 2010).
Answering Brief in Opposition re 141 Motion for Discovery *Motion for the Admission of the Expert Testimony of John T. Goolkasian Relating to the Certificate of Correction for U.S. Patent No. 7,067,396 Plaintiff's Answering Brief in Opposition to Defendant's Motion for the Admission of Expert Testimony of John T. Goolkasian* filed by SOITEC Silicon On Insulator Technologies SA.Reply Brief due date per Local Rules is Jun. 4, 2010. (Attachments: # 1 Certificate of Service)(Kraft, Denise) (Entered May 24, 2010).
Declaration re 145 Answering Brief in Opposition,, *Declaration of Marcus T. Hall in Support of Plaintiff's Answering Brief in Opposition to Defendant's Motion for the Admission of Expert Testimony of John T. Goolkasian* by SOITEC Silicon On Insulator Technologies SA. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).
Reply Brief *In Support of 141 Motion for Discovery Motion for the Admission of the Expert Testimony of John T. Goolkasian Relating to the Certificate of Correction for U.S. Patent No. 7,067,396* filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).
Statement re 148 Stipulation *Joint Claim Construction Statement* by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 14, 2010).
Claim Construction Chart by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 14, 2010).
Sur-Reply Brief re 141 Motion for Discovery *Motion for the Admission of the Expert Testimony of John T. Goolkasian Relating to the Certificate of Correction for U.S. Patent No. 7,067,396 Surreply by Plaintiffs to Motion by Defendant for the Admission of Expert Testimony of John T. Goolkasian* filed by SOITEC Silicon On Insulator Technologies SA. (Attachments: # 1 Certificate of Service)(Kraft, Denise) (Entered: Jun. 15, 2010).
Declaration re 157 Sur-Reply Brief, *Declaration of Marcus T. Hall in Support of Surreply by Plaintiffs to Motion by Defendant for the Admission of Expert Testimony of John T. Goolkasian* by SOITEC Silicon On Insulator Technologies SA. (Attachments: # 1 Exhibit A, # 2 Exhibit B, # 3 Exhibit C, # 4 Exhibit D, # 5 Certificate of Service)(Kraft, Denise) (Entered: Jun. 15, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113- DA0152, # 6 Appendix DA0153-DA0192, # 7 Appendix DA0193-DA0232, # 8 Appendix DA0233-DA0272, # 9 Appendix DA0273-DA0312, # 10 Appendix DA0313- DA0352, # 11 Appendix DA0353-DA0392, # 12 Appendix DA0393-DA0432, # 13 Appendix DA0433-DA0472, # 14 Appendix DA0473-DA0512, # 15 Appendix DA0513-DA0521, # 16 Appendix DA0522-DA0545, # 17 Appendix Sealed—DA0546-DA0551, # 18 Appendix DA0552-DA0563, # 19 Appendix Sealed—DA0564-DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653-DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723- DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).
Claim Construction Opening Brief *Plaintiffs S.O.I.TEC Silicon on Insulator Technologies, S.A. and Commissariat a L'Energie Atomique's Opening Claim Construction Brief* filed by Commissariat a LEnergie Atomique, SOITEC Silicon On Insulator Technologies SA. (Attachments: # 1 Certificate of Service)(Kraft, Denise) (Entered: Jun. 25, 2010).
Declaration re 168 Claim Construction Opening Brief, *Declaration of Marcus T. Hall in Support of Plaintiffs S.O.I.TEC Silicon On Insulator Technologies, S.A. and Commissariat a L'Energie Atomique's Opening Claim Construction Brief* by Commissariat a LEnergie Atomique, SOITEC Silicon On Insulator Technologies SA. (Attachments: # 1 Certificate of Service)(Kraft, Denise) (Entered: Jun. 25, 2010).
Appendix re 167 Claim Construction Opening Brief,,,,,, by MEMC Electronic Materials Inc.. (Attachments: # 1 Appendix DA-0001-DA-0006, # 2 Appendix DA-0007-DA-0032, # 3 Appendix DA-0033-DA-0072, # 4 Appendix DA-0073-DA-0112, # 5 Appendix DA-0113-DA-0152, # 6 Appendix DA-0153-DA-0192, # 7 Appendix DA-0193-DA-0232, # 8 Appendix DA-0233-DA-0272, # 9 Appendix DA-0273-DA-0312, # 10 Appendix DA-0313-DA-0352, # 11 Appendix DA-0353-DA-0392, # 12 Appendix DA-0393-DA-0432, # 13 Appendix DA-0433-DA-0472, # 14 Appendix DA-0473-DA-0512, # 15 Appendix DA-0513-DA-0521)(Rogowski, Patricia) (Entered: Jun. 28, 2010).
Redacted Version of 175 Appendix by MEMC Electronic Materials Inc.. (Attachments: # 1 Appendix DA0522-DA0545, # 2 Appendix DA0546-DA0551, # 3 Appendix DA0552-DA0563, # 4 Appendix DA0564-DA0566, # 5 Appendix DA0567-DA0573, # 6 Appendix DA0574-DA0599, # 7 Appendix DA0600-DA0604, # 8 Appendix DA0605-DA0609, # 9 Appendix DA0610-DA0625, # 10 Appendix DA0626-DA0634, # 11 Appendix DA0635, # 12 Appendix DA0636-DA0652, # 13 Appendix DA0653-DA0657, # 14 Appendix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: Jun. 28, 2010).
Notice of filing the following document(s) in paper format: Joint Appendix of Exhibits to Opening and Answering Claim Construction Briefs (1) vol. I—JA0001 to JA0533. Appendix vol. I. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (2) vol. II—JA0534 to JA0930. Appendix vol. II. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on File in the Clerks Office) (lid) (Entered: Jun. 28, 2010) (2 parts).
Notice of filing the following document(s) in paper format: Joint Appendix of Exhibits to Opening and Answering Claim Construction Briefs (4) vol. IV—JA1503 to JA1510. Appendix vol. IV. re 173 Notice of Filing Paper Documents, (Oversized Document, Item on File in the Clerks Office) (lid) (Entered: Jun. 28, 2010).
Notice of filing the following document(s) in paper format: Joint Appendix of Exhibits to Opening and Answering Claim Construction Briefs (5) vol. V—JA1511 to JA2089 (2 parts).
vol. VI—JA2090 to JA2557. Original document(s) to be filed with the Clerk's Office. Notice filed by Denise Seastone Kraft on behalf of Commissariat a LEnergie Atomique, SOITEC Silicon On Insulator Technologies SA (Attachments: # 1 Certificate of Service)(Kraft, Denise) (Entered: Jun. 25, 2010).

Motion in Limine *SOITEC/CEA Parties' Motion to Exclude the Expert Report of Dr. Pascal Belton and Any Related Testimony*—filed by Commissariat a LEnergie Atomique, SOITEC Silicon On Insulator Technologies SA. (Attachments: # 1 Text of Proposed Order, # 2 Certificate of Service)(Kraft, Denise) (Entered: Jul. 2, 2010).
Motion for Partial Summary Judgment of *Invalidity of the Asserted Aspar Patent Claims*—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 Motion in Limine *SOITEC/CEA Parties' Motion to Exclude The Expert Report of Dr. Pascal Bellon and Any Related Testimony* filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Opening Brief in Support re 187 Motion for Partial Summary Judgment *of Invalidity of the Asserted Aspar Patent Claims* filed by MEMC Electronic Materials Inc..Answering Brief/Response due date per Local Rules is Jul. 19, 2010. (Rogowski, Patricia) (Entered: Jul. 2, 2010).
Appendix re 186 Motion in Limine *SOITEC/CEA Parties' Motion to Exclude the Expert Report of Dr. Pascal Bellon and Any Related Testimony Plaintiffs' Omnibus Appendix to Daubert Motion and Motions for Partial Summary Judgment Filed on Jul. 2, 2010* by Commissariat a LEnergie Atomique, SOITEC Silicon On Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, # 12 Appendix vol. XVI of XIX, # 13 Appendix vol. XVIII of XIX, # 14 Certificate of Service)(Kraft, Denise) (Entered: Jul. 2, 2010).
Motion for Summary Judgment of *Non-Infringement*—filed by MEMC Electronic Materials Inc.. (Attachments: # 1 Text of Proposed Order, # 2 Certificate of Service)(Rogowski, Patricia) (Entered: Jul. 2, 2010).
Motion for Partial Summary Judgment *SOITEC/CEA Parties Motion for Partial Summary Judgment That the Patents in Suit Satisfy the Written Description Requirement*—filed by Commissariat a LEnergie Atomique, SOITEC Silicon On Insulator Technologies SA. (Attachments: # 1 Certificate of Service)(Kraft, Denise) (Entered: Jul. 2, 2010).
Opening Brief in Support re 202 Motion for Partial Summary Judgment *SOITEC/CEA Parties Motion for Partial Summary Judgment That the Patents in Suit Satisfy the Written Description Requirement* filed by Commissariat a LEnergie Atomique, SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That the Certificate of Correction for the '396 Patent is Valid*—filed by Commissariat a LEnergie Atomique, SOITEC Silicon On Insulator Technologies SA. (Attachments: #1 Certificate of Service)(Kraft, Denise) (Entered: Jul. 2, 2010).
Opening Brief in Support re 204 Motion for Partial Summary Judgment *Plaintiffs' Motion for Partial Summary Judgment That the Certificate of Correction for the '396 Patent is Valid* filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC/CEA Parties' Motion for Partial Summary Judgment That the Aspar Patents Are Not Invalid for Inequitable Conduct*—filed by Commissariat a LEnergie Atomique, SOITEC Silicon On Insulator Technologies SA, SOITEC U.S.A., Inc.. (Attachments: #1 Text of Proposed Order, # 2 Certificate of Service)(Kraft, Denise) (Entered: Jul. 2, 2010).
Opening Brief in Support re 206 Motion for Partial Summary Judgment *SOITEC/CEA Parties' Motion for Partial Summary Judgment That the Aspar Patents Are Not Invalid for Inequitable Conduct* filed by Commissariat a LEnergie Atomique, SOITEC Silicon On Insulator Technologies SA, SOITEC U.S.A., Inc..Answering Brief/Response due date per Local Rules is Jul. 19, 2010. (Attachments: #1 Certificate of Service)(Kraft, Denise) (Entered: Jul. 2, 2010).
Motion for Partial Summary Judgment *Plaintiffs' Motion for Partial Summary Judgment That the Bruel Patent Does Not Anticipate the Aspar Patents*—filed by Commissariat a LEnergie Atomique, SOITEC Silicon On Insulator Technologies SA. (Attachments: #1 Text of Proposed Order, # 2 Certificate of Service)(Kraft, Denise) (Entered: Jul. 2, 2010).
Opening Brief in Support Motion re 208 Motion for Partial Summary Judgment *Plaintiffs' Motion for Partial Summary Judgment That the Bruel Patent Does Not Anticipate the Aspar Patents* filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC's Motion for Partial Summary Judgment of Invalidity of United States Patent No. 5,834,812 for Lack of Enablement*—filed by SOITEC Silicon On Insulator Technologies SA, SOITEC U.S.A., Inc.. (Attachments: #1 Text of Proposed Order, # 2 Certificate of Service)(Kraft, Denise) (Entered: Jul. 2, 2010).
Opening Brief in Support re 210 Motion for Partial Summary Judgment *SOITEC's Motion for Partial Summary Judgment of Invalidity of United States Patent No. 5,834,812 for Lack of Enablement* filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC's Motion for Partial Summary Judgment for Invalidity of Asserted Claims of United States Patent No. 5,834,812 in View of Prior Art*—filed by SOITEC Silicon On Insulator Technologies SA, SOITEC U.S.A., Inc.. (Attachments: # 1 Text of Proposed Order, # 2 Certificate of Service)(Kraft, Denise) (Entered: Jul. 2, 2010).
Motion for Partial Summary Judgment *That the Best Mode Requirement is Satisfied for the Claims of the '009 and '396 Patents*—filed by Commissariat a LEnergie Atomique, SOITEC Silicon On Insulator Technologies SA. (Attachments: # 1 Text of Proposed Order, # 2 Certificate of Service)(Reed, John) (Entered: Jul. 2, 2010).
Opening Brief in Support re 212 Motion for Partial Summary Judgment *SOITEC's Motion for Partial Summary Judgment for Invalidity of Asserted Claims of United States Patent No. 5,834,812 in View of Prior Art* filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Opening Brief in Support re 213 Motion for Partial Summary Judgment *That the Best Mode Requirement is Satisfied for the Claims of the '009 and '396 Patents* filed by SOITEC Silicon On Insulator Technologies SA.Answering Brief/Response due date per Local Rules is Jul. 19, 2010. (Attachements: # 1 Certificate of Service)(Reed, John) (Entered: Jul. 2, 2010).
Redacted Version of 200 Opening Brief in Support, by MEMC Electronic Materials Inc.. (Attachments:# 1 Certificate of Service)(Rogowski, Patricia) (Entered: Jul. 7, 2010).
Redacted Version of 201 Appendix by MEMC Electronic Materials Inc.. (Attachments: # 1 Appendix MA0001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 Appendix MA0053-MA0078, # 9 Appendix MA0079-MA0092, # 10 Appendix MA0093-MA0129, # 11 Appendix MA0130-MA0148, # 12 Appendix MA0149-MA0160, # 13 Appendix MA0161-MA0163, # 14 Appendix MA0164-MA0167, # 11 5 Appendix MA0168-MA0172, # 16 Appendix MA0173-MA0183, # 17 Appendix MA0184-MA0196, # 18 Appendix MA0197-MA0207, # 19 Appendix MA0208-MA0241, # 20 Appendix MA0242-MA0245, # 21 Appendix MA0246-MA0249, # 22 Appendix MA0250-MA0252, # 23 Appendix MA0253-MA0265, # 24 Appendix MA0266-MA0281, # 25 Appendix MA0282-MA0312, # 26 Appendix MA0313-MA0359, # 27 Appendix MA0360-MA0365, # 28 Appendix MA0366, # 29

Appendix MA0367-MA0400, # 30 Appendix MA0401-MA0474, # 31 Appendix MA0475-MA0483, # 32 Certificate)(Rogowski, Patricia) (Entered: Jul. 7, 2010).
Redacted Version of 190 Appendix by MEMC Electronic Materials Inc.. (Attachments: MA0484-MA0489, # 2 Appendix MA0490-MA0515, # 3 Appendix MA0516-MA0534, # 4 Appendix MA0535-MA0541, # 5 Appendix MA0542-MA0550, # 6 Appendix MA0551-MA0561, # 7 Appendix MA0562-MA0564, # 8 Appendix MA0565-MA0569, # 9 Appendix MA0570-MA0574, # 10 Appendix MA0575-MA0576, # 11 Appendix MA0577-MA0601, # 12 Appendix MA0602-MA0603, # 13 Appendix MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630, # 19 Appendix MA0631-MA0653, # 20 Appendix MA0654-MA0685, # 21 Appendix MA0686-MA0701, # 22 Appendix MA0702-MA0732, # 23 Appendix MA0733-MA0742, # 24 Appendix MA0743-MA0750, # 25 Appendix MA0751-MA0766, # 26 Appendix MA0767-MA0772, # 27 Appendix MA0773-MA0780, # 28 Appendix MA0781-MA0807, # 29 Appendix MA0808-MA0824, # 30 Appendix MA0825-MA0831.1, # 31 Appendix MA0832-MA0838, # 32 Appendix MA0839-MA0844, # 33 Appendix MA0845-MA0858, # 34 Appendix MA0859-MA0868, # 35 Appendix MA0869-MA0877, # 36 Appendix MA0878-MA0884, # 37 Appendix MA0885-MA0887, # 38 Appendix MA0888-MA0891, # 39 Appendix MA0892-MA0909, # 40 Appendix MA0910-MA0931, # 41 Certificate of Service)(Rogowski, Patricia) (Entered: Jul. 7, 2010).
Redacted Version of 198 Opening Brief in Support,, *SOITEC/CEA Parties' Opening Brief in Support of Motion For Summary Judgment: Non-Infringment* by Commissariat a LEnergie Atomique, SOITEC Silicon On Insulator Technologies SA, SOITEC U.S.A., Inc.. (Kraft, Denise) (Entered: Jul. 8, 2010).
Redacted Version of 197 Sealed Motion for Summary Judgment *SOITEC/CEA Parties' Motion for Summary Judgment: Non-Infringement (Filed Under Seal)*Sealed Motion for Summary Judgment *SOITEC/CEA Parties' Motion for Summary Judgment: Non-Infringement (Filed Under Seal) SOITEC/CEA Parties' Motion for Summary Judgment: Non-Infringement* by Commissariat a LEnergie Atomique, SOITEC Silicon On Insulator Technologies SA, Soitec U.S.A., Inc.. (Kraft, Denise) (Entered: Jul. 8, 2010).
Redacted Version of 192 Appendix, *Plaintiffs' Omnibus Appendix to Daubert Motion and Motions for Partial Summary Judgment Filed on Jul. 2, 2010—vol. VI of XIX* by Commissariat a LEnergie Atomique, SOITEC Silicon On Insulator Technologies SA, SOITEC U.S.A., Inc.. (Kraft, Denise) (Entered: Jul. 9, 2010).
Redacted Version of 193 Appendix, *Plaintiffs' Omnibus Appendix to Daubert Motion and Motions for Partial Summary Judgment Filed on Jul. 2, 2010—vol. VIII of XIX* by Commissariat a LEnergie Atomique, SOITEC Silicon On Insulator Technologies SA, SOITEC U.S.A., Inc.. (Kraft, Denise) (Entered: Jul. 9, 2010).
Redacted Version of 194 Appendix, *Plaintiffs' Omnibus Appendix to Daubert Motion and Motions for Partial Summary Judgment Filed on Jul. 2, 2010—vol. X of XIX* by Commissariat a LEnergie Atomique, SOITEC Silicon On Insulator Technologies SA, SOITEC U.S.A., Inc.. (Kraft, Denise) (Entered: Jul. 9, 2010).
Redacted Version of 195 Appendix, *Plaintiffs' Omnibus Appendix to Daubert Motion and Motions for Partial Summary Judgment Filed on Jul. 2, 2010—vol. XVII of XIX* by Commissariat a LEnergie Atomique, SOITEC Silicon On Insulator Technologies SA, SOITEC U.S.A., Inc.. (Kraft, Denise) (Entered: Jul. 9, 2010).
Redacted Version of 196 Appendix, *Plaintiffs' Omnibus Appendix to Daubert Motion and Motions for Partial Summary Judgment Filed on Jul. 2, 2010—vol. XIX of XIX* by Commissariat a LEnergie Atomique, SOITEC Silicon On Insulator Technologies SA, SOITEC U.S.A., Inc.. (Kraft, Denise) (Entered: Jul. 9, 2010).
Claim Construction Answering Brief re 168 Claim Construction Opening Brief, filed by MEMC Electronic Materials Inc.. (Attachments: # 1 Certificate of Service)(Rogowski, Patricia) (Entered: Jul. 9, 2010).
Appendix re 228 Claim Construction Answering Brief by MEMC Electronic Materials Inc.. (Attachments: # 1 Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Service)(Rogowski, Patricia) (Entered: Jul. 9, 2010).
Claim Construction Answering Brief re 168 Claim Construction Opening Brief, 228 Claim Construction Answering Brief *Plaintiff's S.O.I.TEC On Insulator Technologies, S.A. and Commissariat A Energie Atomique's Answering Claim Construction Brief* filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Jul. 9, 2010).
Appendix re 230 Claim Construction Answering Brief, *Appendix to Plaintiffs S.0.I.TEC On Insulator Technologies, S.A. and Commissariat a Energie Atomique's Answering Claim Construction Brief* by Commissariat a LEnergie Atomique, SOITEC Silicon On Insulator Technologies SA. (Attachments: # 1 Appendix PA-0001-PA-0050, # 2 Appendix PA-0051-PA-0083, # 3 Certificate of Service)(Kraft, Denise) (Entered: Jul. 9, 2010).
Redacted Version of 183 Appendix, *Joint Appendix of Exhibits to Opening and Answering Claim Construction Briefs vol. IV of VI* by Commissariat a LEnergie Atomique, SOITEC Silicon On Insulator Technologies SA. (Kraft, Denise) (Entered: Jul. 12, 2010).
Redacted Version of 170 Exhibit to a Document, *Exhibit A to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon On Insulator Technologies SA. (Kraft, Denise) (Entered: Jul. 12, 2010).
Redacted Version of 171 Exhibit to a Document, *Exhibit B to Declaration of Marcus T. Hall in Support of Plaintiffs S.O.I.TEC Silicon On Insulator Technologies, S.A. and Commissariat a L'Energie Atomique's Opening Claim Construction Brief* by Commissariat a LEnergie Atomique, SOITEC Silicon On Insulator Technologies SA. (Kraft, Denise) (Entered: Jul. 12, 2010).
Redacted Version of 172 Exhibit to a Document, *Exhibit C to Declaration of Marcus T. Hall in Support of Plaintiffs S.O.I.TEC Silicon On Insulator Technologies, S.A. and Commissariat a L'Energie Atomique's Opening Claim Construction Brief* by Commissariat a LEnergie Atomique, SOITEC Silicon On Insulator Technologies SA. (Kraft, Denise) (Entered: Jul. 12, 2010).
Answering Brief in Opposition re 186 Motion in Limine *SOITEC/CEA Parties' Motion to Exclude the Expert Report of Dr. Pascal Bellon and Any Related Testimony* filed by MEMC Electronic Materials Inc..Reply Brief due date per Local Rules is Jul. 29, 2010. (Rogowski, Patricia) (Entered: Jul. 19, 2010).
Answering Brief in Opposition re 208 Motion for Partial Summary Judgment *Plaintiffs' Motion for Partial Summary Judgment That the Bruel Patent Does Not Anticipate the Aspar Patents* filed by MEMC Electronic Materials Inc..Reply Brief due date per Local Rules is Jul. 29, 2010. (Rogowski, Patricia) (Entered: Jul. 19, 2010).
Answering Brief in Opposition re 202 Motion for Partial Summary Judgment *SOITEC/CEA Parties Motion for Partial Summary Judgment That the Patents in Suit Satisfy the Written Description Requirement* filed by MEMC Electronic Materials Inc..Reply Brief due date per Local Rules is Jul. 29, 2010. (Rogowski, Patricia) (Entered: Jul. 19, 2010).
Answering Brief in Opposition re 204 Motion for Partial Summary Judgment *Plaintiffs' Motion for Partial Summary Judgment That the Certificate of Correction for the '396 Patent is Valid* filed by MEMC Electronic Materials Inc..Reply Brief due date per Local Rules is Jul. 29, 2010. (Rogowski, Patricia) (Entered: Jul. 19, 2010).
Answering Brief in Opposition re 210 Motion for Partial Summary Judgment *SOITEC's Motion for Partial Summary Judgment of Invalidity of United States Patent No. 5,834,812 for Lack of Enablement* filed by MEMC Electronic Materials Inc..Reply Brief due date per Local Rules is Jul. 29, 2010. (Rogowski, Patricia) (Entered: Jul. 19, 2010).
Answering Brief in Opposition re 212 Motion for Partial Summary Judgment *SOITEC's Motion for Partial Summary Judgment for Invalidity of Asserted Claims of United States Patent No. 5,834,812 in View of Prior Art* filed by MEMC Electronic Materials Inc..Reply Brief due date per Local Rules is Jul. 29, 2010. (Rogowski, Patricia) (Entered: Jul. 19, 2010).
Appendix re 247 Answering Brief in Opposition,, *Appendix to Plaintiffs' Answering Brief in Opposition to Defendant's Motion for Par-*

*tial Summary Judgment of Invalidity of the Asserted Aspar Claims (PA-1103-PA-1156)* by Commissariat a LEnergie Atomique, SOITEC Silicon On Insulator Technologies SA. (Attachments: # 1 Exhibit PA-1103-PA-1109—Filed Under Seal, # 2 Exhibit PA-1110-PA-1118—Filed Under Seal, # 3 Exhibit PA-1119-PA-1130—Filed Under Seal, # 4 Exhibit PA-1131-PA-1143—Filed Under Seal, # 5 Exhibit PA-1144-PA-1156, # 6 Certificate of Service)(Kraft, Denise) (Entered: Jul. 19, 2010).

Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon On Insulator Technologies SA. (Attachments: # 1 Exhibit PA-1190-PA-1191, # 2 Certificate of Service)(Kraft, Denise) (Entered: Jul. 19, 2010).

Redacted Version of 241 Answering Brief in Opposition, to *Plaintiffs' Motion for Partial Summary Judgment that the Best Mode Requirement is Satisfied for the Claims of the '009 and '396 Patents* by MEMC Electronic Materials Inc.. (Rogowski, Patricia) (Entered: Jul. 26, 2010).

Redacted Version of 249 Answering Brief in Opposition, to *Plaintiffs' Motion for Summary Judgment on the Infringement of U.S. Patent No. 5,834,812* by MEMC Electronic Materials Inc.. (Rogowski, Patricia) (Entered: Jul. 26, 2010).

Redacted Version of 253 Answering Brief in Opposition, to *Plaintiff's Motion for Partial Summary Judgment that the Aspar Patents Are Not Invalid for Inequitable Conduct* by MEMC Electronic Materials Inc.. (Rogowski, Patricia) (Entered: Jul. 26, 2010).

Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appendix MA1145-MA1200, # 5 Appendix MA1201-MA1265, # 6 Appendix MA1265.1-MA1338, # 7 Appendix MA1339-MA1547, # 8 Appendix MA1548-MA1627, # 9 Appendix MA1628-MA1693, # 10 Appendix MA1694-MA1953, # 11 Appendix MA1954-MA2127, # 12 Appendix MA2128-MA2206, # 13 Appendix MA2207-MA2253, # 14 Appendix MA2254-MA2273, # 15 Appendix MA2274-MA2333, # 16 Appendix MA2334-MA2337, # 17 Appendix MA2338-MA2342, # 18 Appendix MA2343-MA2346, # 19 Appendix MA2347-MA2351, # 20 Certificate of Service)(Rogowski, Patricia) (Entered: Jul. 26, 2010) (2 parts).

Redacted Version of 261 Answering Brief in Opposition, to *Plaintiffs' Motion for Partial Summary Judgment that the Best Mode Requirement is Satisfied for the Claims of the '009 and '396 Patents* (Corrected Version of D.I. 241) by MEMC Electronic Materials Inc.. (Rogowski, Patricia) (Entered: Jul. 26, 2010).

Redacted Version of 250 Answering Brief in Oppositon, to *Soitec's Brief in Opposition to Defendant's Motion for Summary Judgment of Non-Infringment* by Commissariat a LEnergie Atomique, SOITEC Silicon On Insulator Technologies SA. (Attachments: # 1 Certificate of Service)(Kraft, Denise) (Entered: Jul. 26, 2010).

Redacted Version of 247 Answering Brief in Opposition to *Plaintiffs' Answering Brief in Opposition to Defendant's Motion for Partial Summary Judgment of Invalidity of the Asserted Aspar Claims* by Commissariat a LEnergie Atomique, SOITEC Silicon On Insulator Technologies SA. (Attachments: # 1 Certificate of Service)(Kraft, Denise) (Entered: Jul. 26, 2010).

Redacted Version of 254 Appendix,, to *Appendix to Plaintiffs' Answering Brief in Opposition to Defendant's Motion for Partial Summary Judgment of Invalidity of the Asserted Aspar Claims (PA-1103-PA-1143* by Commissariat a LEnergie Atomique, SOITEC Silicon On Insulator Technologies SA. (Kraft, Denise) (Entered: Jul. 26, 2010).

Redacted Version of 251,, to *Appendix to Appendix to Plaintiffs' Answering Brief in Opposition to Defendant's Motion for Summary Judgment of Non-Infringement* by Commissariat a LEnergie Atomique, SOITEC Silicon On Insulator Technologies SA. (Kraft, Denise) (Entered: Jul. 26, 2010).

Reply Brief re 204 Motion for Partial Summary Judgment *Plaintiffs' Motion for Partial Summary Judgment That the Certificate of Correction for the '396 Patent is Valid Reply Brief in Support of Plaintiff's Motion for Partial Summary Judgment That the Certificate of Correction for the '396 Patent is Valid* filed by Commissariat a LEnergie Atomique, SOITEC Silicon On Insulator Technologies SA. (Attachments: # 1 Certificate of Service)(Kraft, Denise) (Entered: Jul. 30, 2010).

Declaration re 268 Reply Brief, *Declaration of Marcus T. Hall in Support of Reply Brief in Support of Plaintiffs' Motion for Partial Summary Judgment That the Certificate of Correction for the '396 Patent is Valid* by Commissariat a LEnergie Atomique, SOITEC Silicon On Insulator Technologies SA. (Attachments: # 1 Exhibit A, # 2 Certificate of Service)(Kraft, Denise) (Entered: Jul. 30, 2010).

Appendix re 268 Reply Brief, *Omnibus Appendix to Plaintiffs' Reply Briefs in Support of Plaintiffs' Daubert Motion and Motions for Partial Summary Judgment* (Pa-1192-Pa-1261) by Commissariat a LEnergie Atomique, SOITEC Silicon On Insulator Technologies SA. (Attachments: # 1 Exhibit PA-1199-PA-1204, # 2 Exhibit PA-1205-PA-1206, # 3 Exhibit PA-1206.1, # 4 Exhibit PA-1231-PA-1237, # 5 Exhibit PA-1238-PA-1245, # 6 Exhibit PA-1246-PA-1257, # 7 Exhibit PA-1258-PA-1261, # 8 Certificate of Service)(Kraft, Denise) (Entered: Jul. 30, 2010).

Reply Brief re 210 Motion for Partial Summary Judgment *SOITEC's Motion for Partial Summary Judgment of Invalidity of United States Patent No. 5,834,812 for Lack of Enablement Reply Brief in Support of SOITEC's Motion for Partial Summary Judgment of Invalidity of United States Patent No. 5,834,812 for Lack of Enablement* filed by SOITEC Silicon On Insulator Technologies SA, SOITEC U.S.A., Inc.. (Attachments: # 1 Certificate of Service)(Kraft, Denise) (Entered: Jul. 30, 2010).

Reply Brief re 212 Motion for Partial Summary Judgment *SOITEC's Motion for Partial Summary Judgment For Invalidity of Asserted Claims of United States Patent No. 5,834,812 in View of Prior Art Reply Brief in Support of SOITEC's Motion for Partial Summary Judgment for Invalidity of Asserted Claims of United States Patent No. 5,834,812 in View of Prior Art* filed by SOITEC Silicon On Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).

Reply Brief re 202 Motion for Partial Summary Judgment *SOITEC/CEA Parties Motion for Partial Summary Judgment That the Patents in Suit Satisfy the Written Description Requirement Reply Brief in Support of SOITEC/CEA Parties' Motion for Partial Summary Judgment That the Patents in Suit Satisfy the Written Description Requirement* filed by Commissariat a LEnergie Atomique, SOITEC Silicon On Insulator Technologies SA. (Attachments: # 1 Certificate of Service)(Kraft, Denise) (Entered: Jul. 30, 2010).

Redacted Version of 269 Appendix, *To Reply Brief in Support of MEMC's Motion for Partial Summary Judgment of Invalidity of the Asserted Aspar Patent Claims* by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).

Redacted Version of 273 Appendix *Reply Brief in Support of MEMC's Motion for Summary Judgment of Non-Infringement* by MEMC Electronic Materials Inc.. (Attachments: # 1 Appendix Table of Contents, # 2 Appendix MA2352-MA2361, # 3 Appendix MA2362-MA2371, # 4 Appendix MA2372-MA2381, # 5 Appendix MA2382-MA2391, # 6 Appendix MA2392-MA2399, # 7 Appendix MA2400-MA2404, # 8 Appendix MA2405-MA2422, # 9 Appendix MA2423-MA2425, # 10 Appendix MA2426-MA2427, # 11 Appendix MA2428-MA2430, # 12 Appendix MA2431-MA2440, # 13 Appendix MA2441-MA2448, # 14 Appendix MA2449-MA2452, # 15 Appendix MA2452.1-MA2452.9, # 16 Certificate of Service)(Rogowski, Patricia) (Entered: Aug. 3, 2010).

Redacted Version of 267 Reply brief *In Support of MEMC's Motion for Partial Summary Judgment of Invalidity of the Asserted Aspar Patent Claims* by MEMC Electronic Materials Inc.. (Rogowski, Patricia) (Entered: Aug. 3, 2010).

Redacted Version of 271 Reply Brief *In Support of MEMC's Motion for Summary Judgment of Non-Infringement* by MEMC Electronic Materials Inc.. (Rogowski, Patricia) (Entered: Aug. 3, 2010).

Redacted Version of 274 Appendix,, Omnibus Appendix to Plaintiffs' Reply Briefs in Support of Plaintiffs' Daubert Motion and Motions for Partial Summary Judgment (PA-1192-PA-1198 and PA-1207-PA- 1230 Filed Under Seal) by Commissariat a LEnergie Atomique, SOITEC Silicon On Insulator Technolgoies SA. (Kraft, Denise) (Entered: Aug. 6, 2010).
Redacted Version of 277 Reply Brief, in Support of SOITEC/CEA Parties' Motion to Exclude the Expert Report of Dr. Pascal Belton and Any Related Testimony by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 278 Reply Brief,, in Support of SOITEC/CEA Parties' Motion for Summary Judgement: Non-Infringement (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 279 Reply Brief,, in Support of Plaintiffs' Motion for Partial Summary Judgment That the Best Mode Requirement is Satisfied for the Claims of the '009 and '396 Patents (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 281 Reply Brief, in Support of Plaintiffs' Motion for Partial Summary Judgment That the Bruel Patent Does Not Anticipate the Aspar Patents (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 282 Reply Brief,, in Support of SOITEC/CEA Parties' Motion for Partial Summary Judgment That the Aspar Patents Are Not Invalid for Inequitable Conduct (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Notice of Service of CD of documents MEMC0782194-MEMC0782500 and FH-10001-FH-80067 by MEMC Electronic Materials Inc..(Rogowski, Patricia) (Entered: Sep. 16, 2010).
Redacted Version of 301 Sealed Motion for Reconsideration Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).
Redacted Version of 302 Declaration, of Michael L. Brody in Support of Motion to Reconsider Request to Modify Protective Order by Commissariat a LEnergie Atomique, SOITEC Silicon On Insulator Technologies SA. (Attachments # 1 Certificate of Service)(Kraft, Denise) (Entered: Sep. 24, 2010).
Redacted Version of 303 Exhibit to a Document Exhibit A to Michael L. Brody in Support of Motion to Reconsider Request to Modify Protective Order by Commissariat a LEnergie Atomique, SOITEC Silicon On Insulator Technologies SA. (Attachments: # 1 Certificate of Service)(Kraft, Denise) (Entered: Sep. 24, 2010).
Redacted Version of 304 Exhibit to a Document Exhibit B to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Redacted Version of 305 Exhibit to a Document Exhibit C to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Redacted Version of 306 Exhibit to a Document Exhibit D to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Proposed Pretrial Order [Proposed] Joint Pretrial Order (Filed Under Seal) by Commissariat a LEnergie Atomique, SOITEC Silicon On Insulator Technologies SA, SOITEC U.S.A., Inc.. (Attachments: # 1 Exhibit 1 (Sealed), # 2 Exhibit 2A (Sealed), # 3 Exhibit 2B (Sealed), # 4 Exhibit 3A (Sealed), # 5 Exhibit 3B (Sealed), # 6 Exhibit 4A (Sealed), # 7 Exhibit 4B (Sealed), # 8 Exhibit 4C (Sealed), # 9 Exhibit 5A (Sealed), # 10 Exhibit 5B (Sealed), # 11 Exhibit 6A (Sealed), # 12 Exhibit 6B (Sealed), # 13 Exhibit 7A (Sealed), # 14 Exhibit 7B (Sealed), # 15 Certificate of Service)(Kraft, Denise) (Entered: Oct. 7, 2010).
Proposed Voir Dire by MEMC Electronic Materials Inc.. (Attachments: # 1 Certificate of Service)(Rogowski, Patricia) (Entered: Oct. 8, 2010).
Verdict Sheet by MEMC Electronic Materials Inc.. (Attachments: # 1 Certificate of Service)(Rogowski, Patricia) (Entered: Oct. 8, 2010).
Proposed Voir Dire by Commissariat a LEnergie Atomique, SOITEC Silicon On Insulator Technologies SA, SOITEC U.S.A., Inc.. (Attachments: # 1 Certificate of Service)(Kraft, Denise) (Entered: Oct. 8, 2010).
Verdict Sheet by Commissariat a LEnergie Atomique, SOITEC Silicon On Insulator Technologies SA, Soitec U.S.A., Inc.. (Attachments: # 1 Certificate of Service)(Kraft, Denise) (Entered: Oct. 8, 2010).
Proposed Jury Instructions by Commissariat a LEnergie Atomique, SOITEC Silicon On Insulator Technologies SA, SOITEC U.S.A., Inc.. (Kraft, Denise) (Entered: Oct. 8, 2010).
Redacted Version of 315 Proposed Pretrial Order,, Redacted Version of [Proposed] Joint Pretrial Order by Commissariat a LEnergie Atomique, SOITEC Silicon On Insulator Technologies SA, SOITEC U.S.A., Inc.. (Attachments: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12 Exhibit 6B, # 13 Exhibit 7A, # 14 Exhibit 7B, # 15 Certificate of Service)(Kraft, Denise) (Entered: Oct. 13, 2010).
Memorandum Opinion. Signed by Judge Sue L. Robinson on Oct. 13, 2010. (nmf) (Entered: Oct. 13, 2010).
Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting in part and denying in part 213 Motion for Partial Summary Judgment. Signed by Judge Sue L. Robinson on Oct. 13, 2010. (nmf) (Entered: Oct. 13, 2010).
Memorandum Order re: claim construction. Signed by Judge Sue L. Robinson on Oct. 13, 2010. (nmf) (Entered: Oct. 13, 2010) Oral Order by Judge Sue L. Robinson on Oct. 14, 2010 that the responses to the issues raised in the exhibits to the joint pre-trial order are to be stricken from the record. (These filings, formerly D.I. Nos. 318 and 323 have been deleted from the docket.) (nmf) (Entered: Oct. 14, 2010).
Amended Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; *granting* 213 Motion for Partial Summary Judgment. Signed by Judge Sue L. Robinson on Oct. 14, 2010. (nmf) (Entered: Oct. 14, 2010) Minute Entry for proceedings held before Judge Sue L. Robinson—Final Pretrial Conference held on Oct. 14, 2010. (Court Reporter V. Gunning.) (nmf) (Entered: Oct. 15, 2010) So Ordered, re 315 Proposed Pretrial Order. Signed by Judge Sue L. Robinson on Oct. 14, 2010. (nmf) (Entered: Oct. 15, 2010).
Motion for Reargument re 327 Memorandum and Order—Reargument of Claim Construction of One Claim Term of U.S. Patent 6,809,009—filed by MEMC Electronic Materials Inc.. (Rogowski, Patricia) (Entered: Oct. 18, 2010).
Second Amended Order re: 325 denying 141 Motion for Discovery; denying 186 Motion in Limine; granting in part and denying in part 187 Motion for Partial Summary Judgment; granting 197 Motion for Summary Judgment ; granting 199 Motion for Summary Judgment **with respect to the '484 patent and with respect to its current process, and denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 19, 2010. (nmf) (Entered: Oct. 19, 2010).
Memorandum Order granting 329 Motion for Reargument re 327 Memorandum and Order—Reargument of Claim Construction of One Claim Term of U.S. Patent 6,809,009. Signed by Judge Sue L. Robinson on Oct. 19, 2010. (nmf) (Entered: Oct. 19, 2010).
Stipulation MEMC's Declaratory Judgment counterclaim asserting invalidity of United States Reissued Patent No. 39,484 in Civil Action No. 1:08-292-SLR is dismissed without prejudice by Commissariat a LEnergie Atomique, SOITEC Silicon On Insulator Technologies SA, SOITEC U.S.A., Inc.. (Kraft, Denise) (nmf, ). (Entered: Oct. 21, 2010).
Stipulation of Fact re 331 Memorandum and Order, 327 Memorandum and Order, 325 Memorandum Opinion by Commissariat a LEnergie Atomique, SOITEC Silicon On Insulator Technologies SA, SOITEC U.S.A., Inc.. (Kraft, Denise) (Entered: Oct. 21, 2010).
Letter to the Honorable Sue L. Robinson from Denise Seastone Kraft regarding Mutually agreed upon narrowing of the issues for trial—re 333 Stipulation, 332 Stipulation,. (Kraft, Denise) (Entered: Oct. 21, 2010) Correcting Entry: The pdf of D.I. 332 has been replaced with the correct pdf of the stipulation per request of filer. (nmf) (Entered: Oct. 22, 2010) So Ordered, re 333 Stipulation filed by SOITEC Silicon On Insulator Technologies SA, SOITEC, U.S.A., Inc., Commissariat a LEnergie Atomique, 332 Stipulation, filed by SOITEC Silicon On Insulator Technologies SA, SOITEC U.S.A., Inc., Commissariat a LEnergie Atomique. Signed by Judge Sue L. Robinson on Oct. 22, 2010. (nmf) (Entered: Oct. 22, 2010).
Voir Dire Questions. Read in Open Court Oct. 25, 2010.(nmf) (Entered: Oct. 25, 2010).
Preliminary Jury Instructions. Read in Open Court Oct. 25, 2010. (nmf) (Entered: Oct. 25, 2010) Minute Entry for proceedings held before Judge Sue L. Robinson: Jury Trial Day 1 held on Oct. 25, 2010. (Court Reporter Valerie Gunning, Brian Gaffigan.) (dlk) (Entered: Oct. 26, 2010).
Plaintiff's Bench Memorandum. Filed in Court Oct. 26, 2010. (nmf) (Entered: Oct. 26, 2010) Minute Entry for proceedings held before Judge Sue L. Robinson—Jury Trial (Day 2) held on Oct. 26, 2010. (Court Reporter Valerie Gunning, Kevin Maurer.) (dlk) (Entered: Oct. 26, 2010) Minute Entry for proceedings held before Judge Sue L. Robinson—Jury Trial—Day 3, held on Oct. 27, 2010. (Court Reporter Valerie Gunning/Kevin Maurer.) (nms) (Entered: Oct. 27, 2010).
Statement—Bench Memorandum Supporting MEMC's Proffer of Admissions by SOITEC in Prior Lawsuit Involving the '564 Patent submitted at trial by MEMC Electronic Materials Inc.. (Attachments: # 1 Exhibit A)(Rogowski, Patricia) (Entered: Oct. 28, 2010) Minute Entry for proceedings held before Judge Sue L. Robinson—Jury Trial—Day 4 held on Oct. 28, 2010. (Court Reporter Valerie Gunning/Kevin Maurer.) (nms) (Entered: Nov. 1, 2010).
Final Jury Instructions read in open Court by Judge Robinson. (lid) (Entered: Nov. 1, 2010) Minute Entry for proceedings held before Judge Sue L. Robinson—Jury Trial held on Nov. 1, 2010. (Day 5) (Court Reporter V. Gunning.) (lid) (Entered: Nov. 2, 2010) Minute Entry for proceedings held before Judge Sue L. Robinson—Jury Trial completed on Nov. 2, 2010. (Day 6) (Court Reporter V. Gunning.) (lid) (Entered: Nov. 2, 2010).
Redacted Version of 342 Jury Verdict. (lid) (Entered: Nov. 2, 2010).
Statement Bench Memorandum in Support of Plaintiffs' Motion for Judgment as a Matter of Law of No Unenforceability of the '009 Patent Due to Inequitable Conduct submitted at trial by Commissariat a LEnergie Atomique, SOITEC Silicon On Insulator Technologies SA, SOITEC U.S.A., Inc.. (Attachments: # 1 Certificate of Service)(Kraft, Denise) (Entered: Nov. 2, 2010).
Answering Brief in Opposition re 301 Sealed Motion for Reconsideration Request to Modify Protective Order (MEMC's Opposition to Plaintiffs' Motion for Reargument Re: Modification of the Protective Order) filed by MEMC Electronic Materials Inc..Reply Brief due date per Local Rules is Nov. 22, 2010. (Attachments: # 1 Exhibit 1 through 5, # 2 Certificate of Service)(Rogowski, Patricia) (Entered: Nov. 12, 2010).

Judgment in favor of defendant MEMC Electronic Materials, Inc. and against plaintiffs S.O.I.TEC Silicon On Insulator Technologies, S.A. and Commisseriat a LEnergie Atomique et aux Energies Alternatives as to the 812 patent. It is Further Ordered that judgment be and is hereby entered in favor of plaintiffs S.O.I.TEC Silicon On Insulator Technologies, S.A. and Commisseriat a LEnergie Atomique et aux Energies Alternatives and against defendant MEMC Electronic Materials, Inc. as to the 009 patent. Signed by Judge Sue L. Robinson on Nov. 15, 2010. (nmf) (Entered: Nov. 15, 2010).
Stipulation Setting Post-Trial Briefing Schedule re 348 Judgment,, by Commissariat a LEnergie Atomique, MEMC Electronic Materials Inc., SOITEC Silicon On Insulator Technologies SA. (Rogowski, Patricia) (Entered: Nov. 15, 2010).
Motion for Reargument re 348 Judgment,, (MEMCs Motion for Reargument of the Courts Order Re: The Unenforceability of the 009 Patent)—filed by MEMC Electronic Materials Inc.. (Attachments: # 1 Exhibit 1)(Rogowski, Patricia) (Entered: Nov. 16, 2010) So Ordered—re 349 Stipulation. Set Post Trial Briefing Schedule: (Opening Brief due Dec. 8, 2010., Answering Brief due Dec. 29, 2010., Reply Brief due Jan. 12, 2010.). Signed by Judge Sue L. Robinson on Nov. 17, 2010. (lid) (Entered: Nov. 17, 2010).
Motion for Leave to File Reply in Support of Plaintiff's Motion for Reargument—filed by Commissariat a LEnergie Atomique, SOITEC Silicon On Insulator Technologies SA. (Attachments: # 1 Text of Proposed Order, # 2 Certificate of Service)(Kraft, Denise) (Entered: Nov. 23, 2010).
Opening Brief in Support re 301 Sealed Motion for Reconsideration Request to Modify Protective Order, 351 Motion for Leave to File Reply in Support of Plaintiff's Motion for Reargument filed by Commissariat a LEnergie Atomique, SOITEC Silicon On Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010).
Stipulation to Extend Time Respond to MEMC's Motion for Reargument of the Court's Order Re: Unenforceability of the '009 Patent to Dec. 3, 2010—filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Nov. 24, 2010) So Ordered—re 353 Stipulation to Extend Time. Set Briefing Schedule: re 350 Motion for Reargument re 348 Judgment,. (Answering Brief due Dec. 3, 2010.). Signed by Judge Sue L. Robinson on Nov. 30, 2010. (lid) (Entered: Nov. 30, 2010).
Stipulation to Extend Time to file Motions and Opening Post-Trial Briefs to Dec. 13, 2010—filed by Commissariat a LEnergie Atomique, SOITEC Silicon On Insulator Technologies SA, SOITEC U.S.A., Inc.. (Kraft, Denise) (Entered: Dec. 3, 2010).
Reply Brief re 350 Motion for Reargument re 348 Judgment (MEMCs Motion for Reargument of the Courts Order Re: The Unenforceability of the 009 Patent) Plaintiffs' Opposition to MEMC's Motion for Reargument of the Court's Order Re: The Unenforceability of the '009 Patent filed by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Dec. 3, 2010) So Ordered—re 354 Stipulation to Extend Time. Set Briefing Schedule: (Post Trial Opening Brief due Dec. 13, 2010.). Signed by Judge Sue L. Robinson on Dec. 6, 2010. (lid) (Entered: Dec. 6, 2010).
Exhibit re 355 Reply Brief, Exhibit B to Plaintiffs' Opposition to MEMC's Motion for Reargument of the Court's Order Re: The Unenforceability of the '009 Patent by Commissariat a LEnergie Atomique, SOITEC Silicon On Insulator Technologies SA, SOITEC U.S.A., Inc.. (Kraft, Denise) (Entered: Dec. 6, 2010).
Answering Brief in Opposition re 351 Motion for Leave to File Reply in Support of Plaintiff's Motion for Reargument filed by MEMC Electronic Materials Inc..Reply Brief due date per Local Rules is Dec. 20, 2010. (Rogowski, Patricia) (Entered: Dec. 10, 2010).
Stipulation to Extend Time Stipulation and Order for Plaintiffs to file Motions and Opening Post-Trial Briefs to Dec. 14, 2010—filed by Commissariat a LEnergie Atomique, SOITEC Silicon On Insulator Technologies SA, SOITEC U.S.A., Inc.. (Kraft, Denise) (Entered: Dec. 13, 2010).
Motion for Judgment as a Matter of Law—MEMC's Renewed Motion for Judgment as a Matter of Law or in the Alternative for a New Trial—filed by MEMC Electronic Materials Inc.. (Rogowski, Patricia) (Entered: Dec. 13, 2010).
Opening Brief in Support re 359 Motion for Judgment as a Matter of Law—MEMC's Renewed Motion for Judgment as a Matter of Law or in the Alternative for a New Trial filed by MEMC Electronic Materials Inc..Answering Brief/Response due date per Local Rules is Dec. 30, 2010. (Attachments: # 1 Exhibit 1, # 2 Certificate of Service)(Rogowski, Patricia) (Entered: Dec. 13, 2010).
Motion for Judgment as a Matter of Law Plaintiffs' Renewed Motion for Judgment as a Matter of Law or in the Alternative for a New Trial—filed by Commissariat a LEnergie Atomique, SOITEC Silicon On Insulator Technologies SA. (Attachments: # 1 Text of Proposed Order, # 2 Certificate of Service)(Kraft, Denise) (Entered: Dec. 14, 2010).
Opening Brief in Support re 361 Motion for Judgment as a Matter of Law Plaintiffs' Renewed Motion for Judgment as a Matter of Law or in the Alternative for a New Trial filed by Commissariat a LEnergie Atomique, SOITEC Silicon On Insulator Technologies SA.Answering Brief/Response due date per Local Rules is Jan. 3, 2011. (Attachments: # 1 Certificate of Service)(Kraft, Denise) (Entered: Dec. 14, 2010).
Motion for Injunctive Relief Plaintiffs' Motion for Injunctive Relief and to Lift Stay on Damages Discovery—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Stipulation to Extend Time due date for Answering and Reply Post-Trial Briefs to Jan. 7, 2011 for Answering Brief and Jan. 21, 2011 for Reply Brief—filed by MEMC Electronic Materials Inc.. (Rogowski, Patricia) (Entered: Dec. 15, 2010) So Ordered—re 365 Stipulation to Extend Time. Set Briefing Schedule: (Answering Post trial Brief due Jan. 7, 2011., Reply post trial Brief due Jan. 21, 2011). Signed by Judge Sue L. Robinson on Dec. 16, 2010. (lid) (Entered: Dec. 17, 2010).
Stipulation to Extend Time Post-Trial Answering Briefs to Jan. 12, 2011—filed by Memc Electronic Materials Inc.. (Rogowski, Patricia) (Entered: Jan. 6, 2011).
Notice of Appearance by Aleine Michelle Porterfield on behalf of Commissariat a LEnergie Atomique, SOITEC Silicon On Insulator Technologies SA, SOITEC U.S.A., Inc. (Attachments: # 1 Certificate of Service)(Porterfield, Aleine) (Entered: Jan. 7, 2011).
Joint Stipulation to Extend Time Post-trial Answering Briefs and Post-trial Reply Briefs to Jan. 14, 2011 and Jan. 28, 2011—filed by MEMC Electronic Materials Inc.. (Rogowski, Patricia) (Entered: Jan. 12, 2011).
Answering Brief in Opposition re 359 Motion for Judgment as a Matter of Law—MEMC's Renewed Motion for Judgment as a Matter of Law or In the Alternative for a New Trial filed by Commissariat a LEnergie Atomique, SOITEC Silicon On Insulator Technologies SA, SOITEC U.S.A., Inc..Reply Brief due date per Local Rules is Jan. 24, 2011. (Attachments: # 1 Certificate of Service)(Kraft, Denise) (Entered: Jan. 14, 2011).
Answering Brief in Opposition re 361 Motion for Judgment as a Matter of Law *Plaintiffs' Renewed Motion for Judgment as a Matter of Law or in the Alternative for a New Trial (MEMCs Answering Brief in Opposition to Plaintiffs Renewed Motion for Judgment as a Matter of Law or in the Alternative for a New Trial)* filed by MEMC Electronic Materials Inc..Reply Brief due date per Local Rules is Jan. 24, 2011. (Attachments: # 1 Certificate of Service)(Rogowski, Patricia) (Entered: Jan. 14, 2011).
Declaration re 378 Answering Brief in Opposition, (*Declaration of Robert M. Evans, Jr. in Support of MEMCs Opposition to Plaintiffs Renewed Motion for Judgment as a Matter of Law or in the Alternative for a New Trial*) by MEMC Electronic Materials Inc.. (Attachments: # 1 Exhibit 1, # 2 Exhibit 2, # 3 Certificate of Service)(Rogowski, Patricia) (Entered: Jan. 14, 2011).
Redacted Version of 376 Answering Brief in Opposition, *to Plaintiffs' Motion for Injunctive Relief and to Lift Stay on Damages Discovery* by MEMC Electronic Materials Inc.. (Attachments: # 1 Certificate of Service)(Rogowski, Patricia) (Entered: Jan. 20, 2011).
Redacted Version of 377 Appendix to *MEMC's Answering Brief in Opposition to Plaintiffs' Motion for Injunctive Relief and to Lift Stay on Damages Discovery* by MEMC Electronic Materials Inc.. (Attachments: # 1 Exhibit 1-7, # 2 Exhibit 8, # 3 Exhibit 9, # 4 Exhibit 10, # 5 Exhibit 11, # 6 Exhibit 12-13, # 7 Exhibit 14, # 8 Exhibit 15, # 9 Exhibit 16, # 10, Exhibit 17, # 11 Exhibit 18, # 12 Exhibit 19, # 13 Certificate of Service)(Rogowski, Patricia) (Entered: Jan. 20, 2011).
Joint Stipulation to Extend Time of Post-Trial Reply Briefs to Tuesday, Feb. 1, 2011—filed by Commissariat a LEnergie Atomique, SOITEC Silicon On Insulator Technologies SA, SOITEC U.S.A., Inc.. (Kraft, Denise) (Entered: Jan. 28, 2011).
Joint Stipulation to Extend Time of Post-Trial Reply Briefs to Friday, Feb. 4, 2011—filed by Commissariat a LEnergie Atomique, SOITEC Silicon On Insulator Technologies SA, SOITEC U.S.A., Inc.. (Kraft, Denise) (Entered: Jan. 31, 2011).
Redacted Version of 364 Opening Brief in Support,,,, *Redacted Version of Opening Brief in Support of Plaintiffs' Motion for Injunctive Relief and to Lift Stay on Damages Discovery* by Commissariat a LEnergie Atomique, SOITEC Silicon On Insulator Technologies SA, SOITEC U.S.A., Inc.. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Exhibit 0, # 16 Exhibit P, # 17 Exhibit Q, # 18 Exhibit R, # 19 Exhibit S)(Kraft, Denise) (Entered: Feb. 2, 2011).
Reply Brief re 359 Motion for Judgment as a Matter of Law—MEMC's Renewed Motion for Judgment as a Matter of Law or in the Alternative for a New Trial filed by MEMC Electronic Materials Inc.. (Attachments: # 1 Certificate of Service)(Rogowski, Patricia) (Entered: Feb. 4, 2011).
Reply Brief re 361 Motion for Judgment as a Matter of Law *Plaintiffs' Renewed Motion for Judgment as a Matter of Law or in the Alternative for a New Trial* filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 4, 2011).
Declaration re 387 Reply Brief, *Declaration of Michael L. Brody in Support of Reply Brief in Support of Plaintiffs' Renewed Motion for Judgment as a Matter of Law or in the Alternative for a New Trial* by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Feb. 4, 2011).
Motion to Strike 386 Reply Brief, *Motion by Plaintiffs' to Strike Reply Brief in Support of MEMC's Renewed Motion for Judgment as a Matter of Law or, in the Alternative, a New Trial (D.I. 386)*—filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 8, 2011).
Opening Brief in Support re 390 Motion to Strike 386 Reply Brief, *Motion by Plaintiffs' to Strike Reply Brief in Support of MEMC's Renewed Motion for Judgment as a Matter of Law or, in the Alternative, a New Trial (D.I. 386)* Motion to Strike 386 Reply Brief, *Motion by Plaintiffs'to Strike Reply Brief in Support of MEMC's Renewed Motion for Judgment as a Matter of Law or, in the Alternative, a New Trial (D.I. 386)* filed by Commissariat a LEnergie Atomique, SOITEC Silicon On Insulator Technologies SA, SOITEC U.S.A., Inc..Answering Brief/Response due date per Local Rules is Feb. 25, 2011. (Attachments: # 1 Certificate of Service)(Kraft, Denise) (Entered: Feb. 8, 2011).
Declaration re 391 Opening Brief in Support,, *Declaration of Marcus T. Hall in Support of Plaintiffs' Opening Brief in Support of Motion to Strike Reply Brief in Support of MEMC's Renewed Motion for Judgment as a Matter of Law or, in the Alternative, a New Trial (D.I. 386)* by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Feb. 8, 2011).
Redacted Version of 289 Reply Brief, *Redacted Version of Reply Brief in Support of Plaintiffs' Motion for Injunctive Relief and to Lift Stay on Damages Discovery* by Commissariat a LEnergie Atomique, SOITEC Silicon On Insulator Technologies SA, SOITEC U.S.A., Inc., (Kraft, Denise) (Entered: Feb. 9, 2011).
Answering Brief in Opposition re 390 Motion to Strike 386 Reply Brief, *Motion by Plaintiffs' to Strike Reply Brief In Support of MEMCs Renewed Motion For Judgment as a Matter of Law or, in the*

*Alternative, a New Trial (D.I. 386)* Motion to Strike 386 Reply Brief, *Motion by Plaintiffs' to Strike Reply Brief in Support of MEMC's Renewed Motion for Judgment as a Matter of Law or, in the Alternative, a New Trial (D.I. 386)* filed by MEMC Electronic Materials Inc..Reply Brief due date per Local Rules is Feb. 28, 2011. (Attachments: # 1 Exhibit 1-3, # 2 Certificate of Service)(Rogowski, Patricia) (Entered: Feb. 18, 2011).

Reply Brief re 390 Motion to Strike 386 Reply Brief, *Motion by Plaintiffs' to Strike Reply Brief in Support of MEMC's Renewed Motion for Judgment as a Matter of Law or, in the Alternative, a New Trial (D.I. 386)* Motion to Strike 386 Reply Brief, *Motion by Plaintiffs' to Strike Reply Brief in Support of MEMC's Renewed Motion for Judgment as a Matter of Law or, in the Alternative, a New Trial (D.I. 386)* filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 28, 2011).

\* cited by examiner

METHOD FOR MAKING A STRESSED STRUCTURE DESIGNED TO BE DISSOCIATED

PRIORITY CLAIM

This application is a divisional application of U.S. application Ser. No. 10/538,482, filed Mar. 17, 2006, now abandoned which is a nationalization under 35 U.S.C. 371 of International Patent Application No. PCT/FR03/03622, filed Dec. 8, 2003, which claims benefit of priority to French Patent Application No. FR 0215550, filed Dec. 9, 2002, all of which are incorporated by reference in their entirety.

TECHNICAL FIELD

The invention relates to a method of producing a complex microelectronic structure by assembling two basic microelectronic structures, this complex structure being intended to be dissociated. The microelectronic structure concept must be understood hereinafter as including optoelectronic, microtechnological, nanotechnological and nanoelectronic structures.

BACKGROUND

The technique of transferring a layer from an original substrate to a temporary or final target substrate is increasingly used in microelectronics. This technique has many applications, of which only two will be mentioned here by way of illustrative and non-limiting example. For example, it is used to produce SQI (silicon on insulator) substrates used in particular to produce fast components with low power consumption. It is also used to produce composite substrates that limit costs by avoiding the use of costly bulk substrates. This is the case with bulk silicon carbide substrates, for example.

One prior art method of transferring a thin layer from a source substrate to a target substrate is described in French Patent Application No. FR 2 681 472 (also U.S. Pat. No. 5,374,564 to M. Bruel) and its various improvements (hereby incorporated by reference). This patent discloses a process comprising the following steps in particular:

creation by ionic implantation of a buried weakened region within the source substrate delimiting within that substrate the thin layer to be transferred, assembling the source substrate to the target substrate at the free surface of the thin layer, and applying thermal and/or mechanical energy to cause a fracture in the source substrate in the weakened region.

A problem can arise if heat treatment is required to induce some or all of the fracture in the weakened region and the source and target substrates feature materials with very different coefficients of thermal expansion. This is the situation, for example, if it is required to transfer a film of silicon onto a fused silica substrate. Heat treatment can induce high internal stresses within the structure formed by assembling the two substrates, by virtue of the difference in their coefficients of thermal expansion, and these high internal stresses may damage the structure. These stresses can also cause damage at the moment of fracture proper, since at this time the structures immediately relax when they are suddenly dissociated. There is therefore at this moment a sudden jump in the stresses in each structure, i.e. the structure formed of the transferred thin layer attached to the target substrate and the structure formed by the remainder of the source substrate. If its magnitude is too high, this jump can damage at least one of these two structures.

To solve this problem, it would be necessary, at the fracture temperature, to be able to monitor precisely the stresses within the structure formed by assembling the two substrates, in order to maintain them below an acceptable stress level or even to minimize them.

More generally, the problem is that of controlling the stresses within a heterostructure (i.e. a complex structure made by assembling at least two different materials) at the moment of dissociation of the heterostructure when that dissociation necessitates a change of temperature.

BRIEF SUMMARY

To solve the stated problem, the invention proposes a method of producing a complex structure by assembling two substrates at respective connecting faces thereof, the structure being adapted to be dissociated in a separation region, characterized in that, prior to assembly, a tangential stress state difference is created between the two faces to be assembled, this difference being selected to obtain a predetermined stress state within the assembled structure at the moment of dissociation.

The tangential stress state difference between the two faces to be assembled is advantageously selected to minimize the stresses in the separation region at the moment of dissociation.

Thus the invention teaches the intentional generation of stresses in the assembled structure to enable it to compensate the stresses that will subsequently be generated when the temperature is increased to dissociate the structure.

It is to be noted that, in an entirely different context, the paper by D. Feijoo, I. Qng, K. Mitani, W. S. Yang, S. Yu and U. M. Gosele, "Prestressing of bonded wafers", Proceedings of the 1st international symposium on semiconductor wafer bonding, Science, Technology and applications, Vol. 92-7, The Electrochemical Society (1992) page 230, proposes a method of generating internal stresses within a complex structure with a view to improving the mechanical stability of the structure.

To this end, two structures, in this instance two silicon wafers, are bonded by molecular adhesion under the standard conditions. The complex structure formed in this way is then stressed by curving it by applying a pointer to the center of the structure, which is fixed at its periphery. By curving the structure sufficiently, the bonding interface yields: the two wafers separate and are then rebonded immediately with the new curvature that has been achieved. This separation/rebonding process may be carried out several times, depending on the bonding energy at the interface and the force applied by means of the pointer. When the authors release the stress caused by the pointer, the complex structure relaxes and stabilizes at a radius of curvature that depends on that obtained at the time of the last separation/rebonding of the complex structure stressed by the pointer. Internal stresses are therefore generated within the complex structure.

However, the internal stresses generated within the structure are not easily adjustable using the above technique because they are dependent on the relative values of the elastic deformation energy of the structure and the bonding energy. Moreover, as the authors indicate, the above method cannot be used for molecular bonding at too high an energy since, under such conditions, the assembled two structures do not separate and, if the pointer is removed within the range of elastic deformation of the structure, the latter reverts to its initial state at the time of molecular bonding. The structure therefore has no curvature and therefore no internal stresses. Now, it is often technologically beneficial to have a high bonding energy, for example to ensure good solidity and a bonding interface of good quality.

The above document is nowhere concerned with monitoring the stresses within the structure linked to a change of temperature.

The technique described in the above document can undoubtedly be used to generate stresses in a complex structure, but this idea is not associated with solving the problem of a heterostructure's temperature behavior. It is therefore only a posteriori that the above document might be seen to have analogies with the invention. In any event, a lack of control of the stresses makes the proposed technique difficult to adjust. It is also limited to structures assembled with limited bonding energies.

The method of the invention does not have the above limitations. The stress state generated within the complex structure depends on stresses generated independently prior to assembly in each substrate. These stresses are accurately variable (see below). The method is therefore accurately reproducible and variable, enabling the stresses to be monitored (or controlled) as a function of future requirements. The bonding forces between the substrates to be assembled are no longer limited since the complex structure does not have to be separated during assembly by the method of the invention.

In the remainder of this document, the substrates to be assembled are also referred to as basic structures, as opposed to the complex structure formed by assembling these two substrates.

The tangential stress difference between the faces to be bonded of the two basic structures may advantageously be created by deforming (mainly elastically) each of said structures before assembly. A simple and easy technique for generating stresses is to curve these structures.

In a preferred embodiment, the two structures are curved so that the two faces to be assembled are respectively concave and convex. They may be complementary or even respectively spherical concave and spherical convex.

For example, the structures may be curved to generate stresses by applying localized and/or distributed mechanical forces to the structures to be deformed.

In a preferred embodiment, a pressure difference may be created between the two faces of the structure to be curved. The means for producing this pressure difference and for obtaining a basic structure having a face to be assembled include aspirating said structure onto a concave preform of suitable profile selected as a function of that to be imparted to the face to be assembled and on which the structure rests locally at its periphery. Seals may advantageously be provided to improve the seal between the structure and the preform. Aspiration of said structure into a cavity (without preform) may also be mentioned, the structure resting locally at its periphery on a seal bordering the cavity.

The curved basic structure may be obtained by deforming the above structure between two complementary preforms, one concave and the other convex, with profiles selected as a function of that to be imparted to the face to be assembled. In this case, aspiration channels may be provided on the preform which receives the basic structure to keep the structure curved, once the other preform has been removed. This other preform may advantageously be the other basic structure to be assembled, which has already been curved to the required profile.

Another option is to apply mechanical forces is simultaneously to both of the structures to be assembled, for example by deforming the two structures between two preforms with profiles selected as a function of those to be imparted to the faces to be assembled.

It is preferable if:
mechanical forces are applied to one or more of the substrates by means of a preform consisting of a mold,
this preform consists of a porous mold, and
mechanical forces are applied to the substrates with the aid of at least one deformable preform.

The two structures are preferably assembled by molecular bonding, achieving high adhesion forces and an interface of good quality. In this case, before or after creating the stress state difference between the two faces to be assembled, said faces are treated to facilitate subsequent bonding. For example, the treatment may consist in mechanical and/or chemical polishing, chemical treatment, UV/ozone treatment, RIE (reactive ion etching), plasma treatment, or annealing in hydrogen, etc.

According to other preferred features of the invention:
the substrates are assembled by direct contact, the surface of at least one of the substrates being adapted to prevent air from being trapped between the assembled surfaces,
at least one of the substrates is pierced,
that substrate is pierced at its center,
at least one of the substrates includes at least one dead-end channel discharging at the edge of the substrate,
the substrates are assembled by means of a flow layer,
assembly is carried out at a temperature above room temperature,
the substrates are heated by contact with heated preforms, and
the preforms are heated to respective different temperatures.

Also, the tangential stress state difference between the two faces to be assembled is advantageously selected so that the prestresses created in this way within the complex structure enable subsequent imposition of specified internal stresses at a specified temperature. The prestresses are advantageously selected to minimize or eliminate the stresses within the complex structure.

The invention also provides a method for transferring a thin layer from a source substrate to a target substrate, comprising the following steps:
ionically implanting the source substrate through one face thereof to create a buried weakened layer at a particular depth relative to the implanted face of the source substrate, a thin layer thereby being delimited between the implanted face and the buried layer,
assembling one face of the source substrate to one face of the target substrate to form an assembled structure,
dissociating the thin layer from the remainder of the source substrate in the buried layer,
the method being characterized in that, prior to assembly, a tangential stress state difference is created between the two faces to be assembled, this difference being selected to obtain within the assembled structure a predetermined stress state at the moment of dissociation.

The tangential stress state difference between the two faces to be assembled is advantageously selected to minimize the stresses in the buried layer at the moment of dissociation. This guarantees the quality of the structures obtained after dissociation.

In a preferred embodiment, the tangential stress state difference between the two faces to be assembled is imposed by curving each of the two substrates to be assembled prior to assembly.

BRIEF DESCRIPTION OF THE DRAWING

Other aspects and advantages of the invention will become apparent on reading the following detailed description of particular embodiments, which is given by way of non-limiting example. The description refers to the appended drawings, in which.

DETAILED DESCRIPTION

In the figures to which the following description refers, identical, similar or equivalent parts are identified by the same reference numbers. Also, to clarify the figures, the various items are not represented to a consistent scale.

To illustrate the invention, there will be described by way of non-limiting example a method of transferring a film consisting of a layer of silicon approximately 0.4 µm thick and a layer of oxide approximately 0.4 µm thick from a 200 mm diameter surface oxidized silicon source substrate 750 µm thick to a 200 mm diameter fused silicon target substrate 1200 µm thick.

The film may be transferred using the following method, employing standard transfer techniques:
ionically implanting the source substrate to create within that substrate a weakened region that delimits the thin layer to be transferred under implantation conditions known to the person skilled in the art, for example hydrogen implantation at a dosage of approximately $6.10^{16}$ H$^+$/cm$^2$ and at an energy of 75 keV,
bonding the oxidized layer of the source substrate to the target substrate by molecular adhesion, and
transferring the thin film by fracture of the weakened region of the source substrate, this fracture being induced by heat treatment at approximately 400° C., for example, and advantageously being accompanied by the application of mechanical forces.

Figure 1:
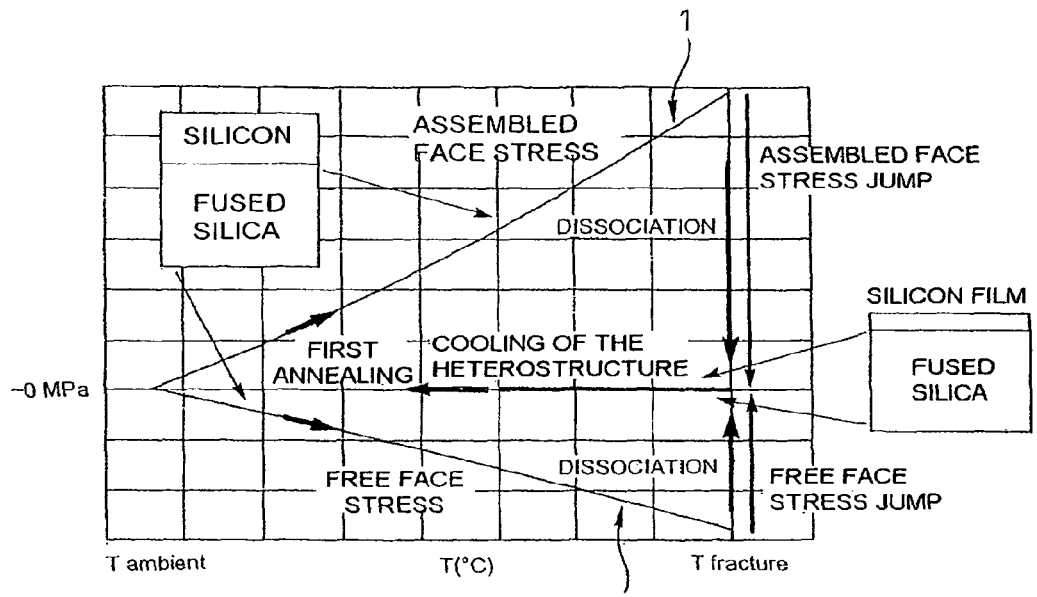
FIG. 1 is a graph showing the evolution of the stresses with temperature at the surfaces of the fused silica substrate within a conventional (silica+silicon) heterostructure.
Figure 2:
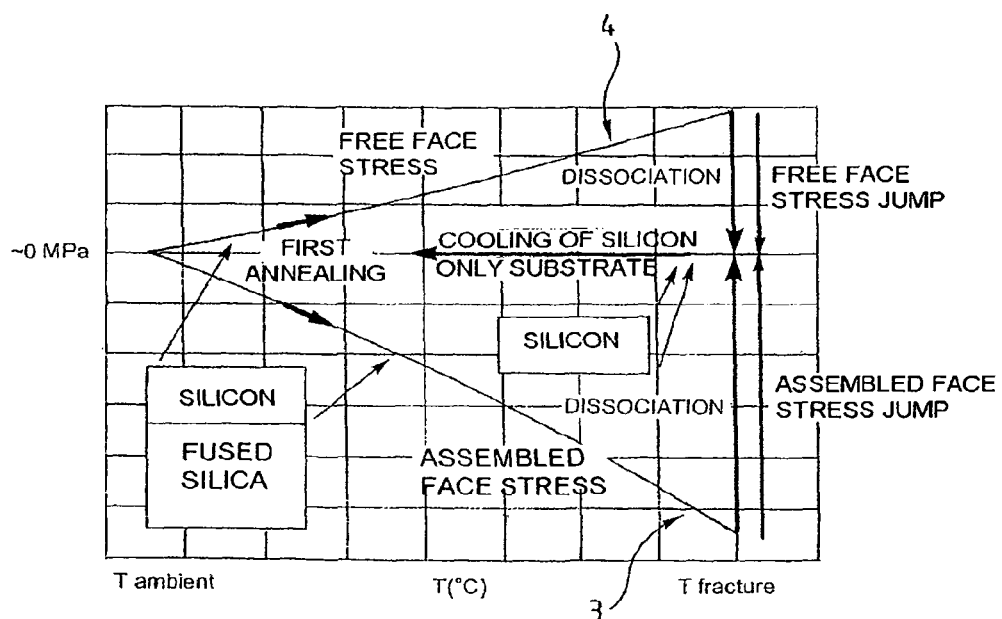
FIG. 2 is a similar graph showing the stresses at the surfaces of the silicon substrate of this heterostructure.

FIGS. 1 and 2 respectively show the calculated stresses generated at the respective surfaces of the fused silica and silicon substrates during heat treatment of the conventional complex structure formed by assembling the two substrates. At room temperature, the two substrates are relaxed and there is no internal stress within the complex structure.

Thereafter, as the temperature rises, the structure is progressively stressed: curve 1 in FIG. 1 shows the evolution of the stresses on the assembled face of the fused silica substrate, curve 2 shows the evolution of the stresses on its free face, curve 3 of FIG. 2 shows the evolution of the tensile stresses on the assembled face of the silicon substrate, and curve 4 shows the evolution of the tensile stresses on its free face.

This evolution of the stresses with temperature is perfectly familiar to and quantifiable by the person skilled in the art. It is described in the following documents: S. TimoshenkO, J. Opt. Soc. am. 11 (1925) page 233/and D. Feijoo, I. Ong, K. Mitani, W. S. Yang, S. Yu and U. M. Gösele, Zhe-Chuan Feng and Hong-du Liu J; Appl. Phys. 54(1), 1983, page 83 "Generalized formula for curvature radius and layer stresses caused by thermal strain in semiconductor multilayer structures".

To a first approximation, using continuous elastic theory mechanical calculations, if the materials are considered to be isotropic and the coefficients of thermal expansion are considered to be constant over the applicable temperature range, the evolution of the stresses is approximately linear with temperature. More complex calculations (for example finite element calculations) may be used to refine these results.

Since silicon has a higher coefficient of thermal expansion than fused silica, as the temperature rises, expansion of the assembled face of the silicon is impeded by the fused silica, which expands less than the silicon.

This face is therefore stressed in compression, causing expansion of its free face because of its stiffness. In parallel with this, the assembled face of the fused silica is expanded by the silicon, leading to compression of its free face because of the stiffness of the fused silica.

At the moment of fracture, these stresses are suddenly released. This corresponds to a jump of approximately 100 MPa in the fracture region of the silicon substrate and of 160 MPa at the assembled face of the fused silica. If they are not controlled, these stress jumps can damage the structures obtained.

On the other hand, according to the invention, the structure is prestressed internally so that at the moment of fracture of the assembled complex structure the stresses are imposed and advantageously below a threshold guaranteeing the quality of the structures obtained after fracture.

Figure 3A:
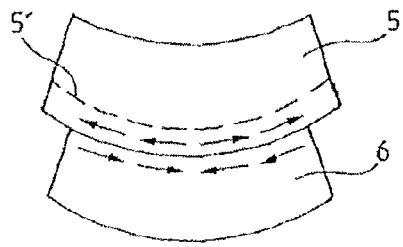
FIG. 3A is a diagram of a heterostructure obtained by the method of the invention and FIG. 3B illustrates the heterostructure after disassociating the thin-film from the remainder of a source substrate.

Consequently, if the silicon source substrate 5 and the fused silica target substrate 6 are curved prior to assembly with a radius of curvature at the faces to be assembled of the order of 1.2 m, and so that the face to be assembled of the silicon substrate 5 is convex and that of the fused silicon substrate 6 is concave, the structure shown in FIG. 3A is obtained after assembly with a given tangential stress level at the bonding interface, the assembled face of the silicon being stressed in tension at room temperature and that of the fused silica being stressed in compression at room temperature. The arrows in FIG. 3A symbolize this stress state at the bonding interface. The line 5' symbolizes a weakened layer produced beforehand by implantation.

Figure 4:
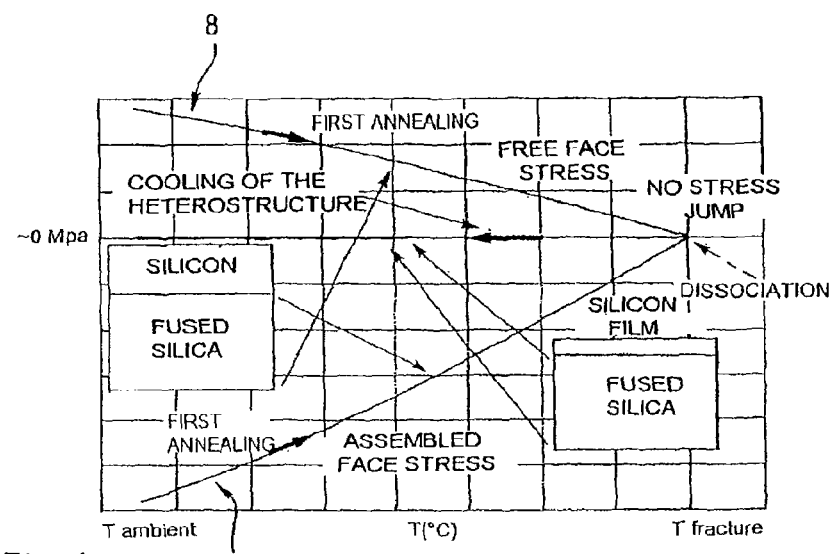
FIGS. 4 and 5 are graphs similar to those of FIGS. 1 and 2 showing the evolution of the stresses with temperature within a heterostructure stressed by the method of the invention.
Figure 5:
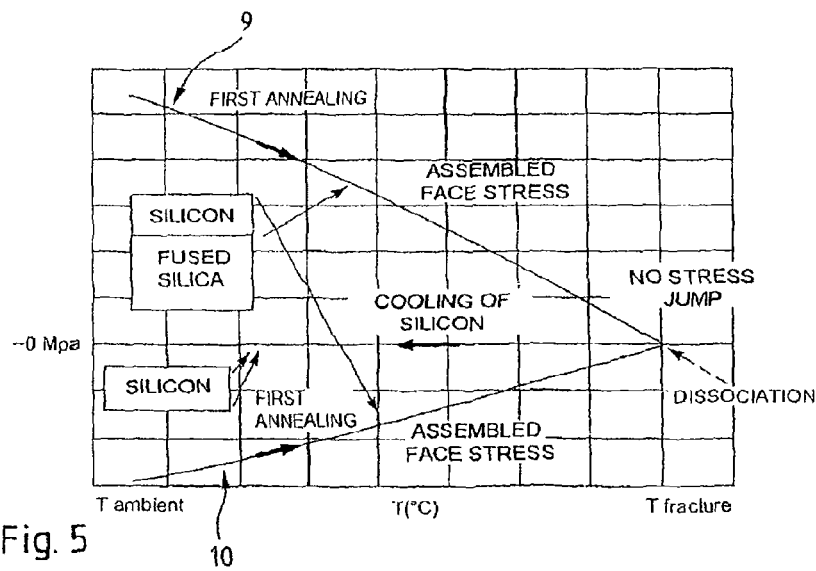

When stressed in this way, the stress level of the complex structure evolves with temperature in the manner shown in FIG. 4 for the assembled face (curve 7) of the fused silica and its free face (curve 8) and in FIG. 5 for the assembled face of the silicon (curve 9) and its free face (curve 10).

It may be seen that at the fracture temperature there is practically no internal stress within the assembled complex structure, either in the silicon substrate or in the fused silica substrate. There is therefore no stress jump at the moment of dissociation (illustrated in FIG. 3B).

In this example, the internal stresses in the fracture region having been minimized at the fracture temperature, those stresses are no longer operative in the fracture mechanism. This can have only a negligible influence on the thermal budget (temperature–time pair) necessary for the fracture and in this case the same thermal budget is retained. In certain cases it could be necessary to modify the heat treatment time for the fracture to be effected compared to the time necessary for the fracture in the case of bonding without prestressing, for example. If it is a requirement that the heat treatment time should not be modified, it would equally be possible to change the heat treatment temperature. A radius of curvature prior to bonding may then advantageously be selected that is adapted to this new temperature. It may also be beneficial to reduce the internal stresses in the assembled structure, without minimizing them. This is the case, for example, if it is necessary to select the thermal budget necessary for the fracture while at the same time guaranteeing the quality of the structures obtained after fracture. The choice may of course be made to apply either generalized or localized stresses (tension, torsion, and the like.) of external origin.

Generating a tangential stress difference between the assembled faces of the source and target substrates therefore limits the stress jumps suffered by the various structures obtained at the moment of dissociation of the assembled structure. If the two substrates to be assembled are bulk substrates and have different coefficients of thermal expansion, the tangential stress state difference between the two faces to be assembled is advantageously selected so that the face of the substrate having the lower coefficient of thermal expansion is stressed in compression relative to the other face to be assembled. The resulting prestressing of the complex structure will then compensate in advance some or all of the future stresses, linked to the rise in temperature, in particular at the dissociation temperature.

Given the selected dissociation temperature and the coefficients of expansion of the materials involved, it will be obvious to the person skilled in the art how to determine the stresses to be generated at the time of assembly.

There are many ways of generating this stress state difference.

Figure 6:
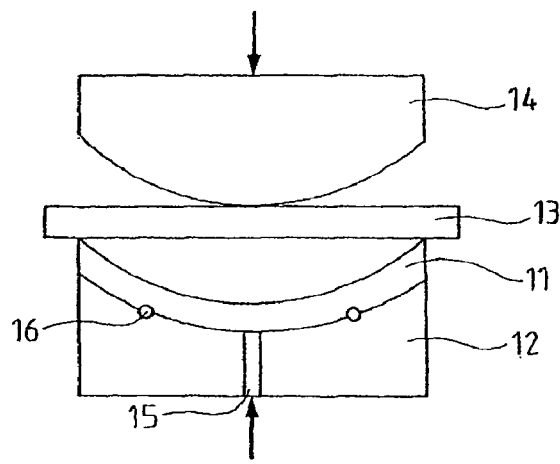
FIG. 6 is a diagram of one non-limiting embodiment of the method of the invention.

FIG. 6 shows one embodiment of the method. A first basic structure 11 is deformed by aspirating it onto a first preform 12 of specific shape, for example of spherical concave shape. Aspiration is effected by means of aspiration channels 15 opening onto the surface of the preform. Seals 16 at the periphery of the preform support the first structure 11 and ensure a pressure difference to be obtained between two faces of that structure. Because of this pressure difference, the structure is deformed to espouse the shape of the first preform 12. Because of this deformation, stresses familiar to and quantifiable by the person skilled in the art are generated within the first structure 11 and in particular at its exposed face (here its upper face).

A second structure 13 is then offered up facing the exposed face of the first structure 11. A second preform 14 with a suitable shape that is advantageously complementary to the shape of the first preform 12, for example of spherical convex shape, is provided to elastically deform the second structure 13 between the second preform 14 and the first structure 11. The arrow represented in FIG. 6 symbolizes the application of forces to effect the deformation proper. During the deformation, the second structure 13 is progressively deformed into contact with the first structure 11 until it espouses its shape.

The two faces to be assembled having been treated in a manner familiar to the person skilled in the art to enable bonding by molecular adhesion, for example prior to stressing the two structures, bonding is then effected when the two faces coincide.

A complex structure of the type in FIG. 3A is then obtained formed by the assembly of two stressed structures having at their assembled faces a known tangential stress difference that is imposed by the respective deformations of the two structures prior to bonding.

The person skilled in the art knows how to link the deformation imposed on the structures accurately to the stress levels obtained in the structure and in particular those obtained on the faces to be assembled. He therefore knows, through an appropriate choice of the shapes of the preforms 12 and 14, how to impose a precise tangential stress difference between the two faces to be assembled before bonding and thus to impose stresses throughout the complex structure once assembled. The preforms may be rigid porous or non-porous molds, for example, or deformable membranes.

Figure 7:
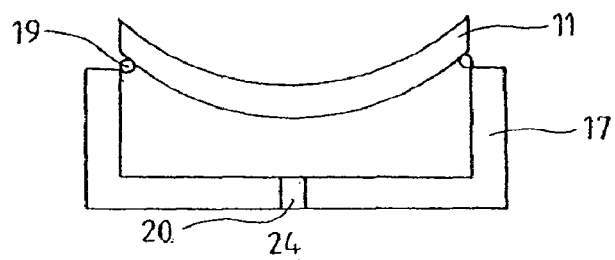
FIGS. 7, 8 and 9 show different ways of stressing basic structures to be assembled.

As shown in FIG. 7, a variant of the method replaces the first preform 12 with a hollow device 17 having a central cavity 18. The periphery of the first structure 11 then rests on this device with seals 19 sandwiched between them. Aspiration channels 20 reduce the pressure inside the cavity. Adjusting the pressure difference between the two faces of the first structure 11 deforms the first structure 11 to a particular curvature. For example, for a vacuum in the cavity of approximately 0.25 bar, the other face of the structure being exposed to atmospheric pressure, a deflection of 3 mm is obtained in the case of a standard 200 mm diameter silicon wafer 750 µm thick using a seal of 195 mm diameter. The first structure 11 can then be assembled to the second structure 3 in the manner explained above.

Figure 8:
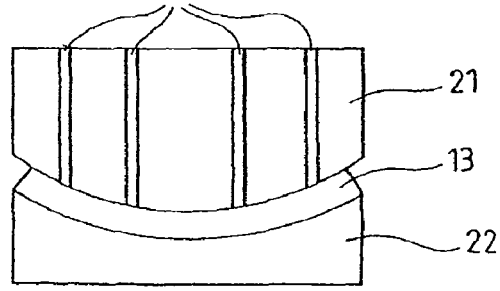

FIG. 8 shows another variant which consists in 15 deforming the second structure 13 between two appropriate preforms of complementary shape, one (22) concave and the other (21) convex. The convex preform is provided with aspiration channels 24 for holding the second structure 13 in position after deformation and removal of the concave preform 22. The second structure 13 may then be assembled to the first structure 11, which itself has already been deformed (for example in accordance with FIG. 7), by bonding with the aid of an adhesive, for example.

Another variant assembles the two basic structures by molecular bonding at room temperature and without stress. The assembled structure is then deformed between two complementary molds. After verifying that each of the structures is fastened to one of the molds (for example by aspiration), the assembled structure is separated from the molecular bonding area by any means known to the person skilled in the art. This yields two stressed basic structures that may thereafter be assembled in accordance with the invention. This variant has the advantage of preserving the surface state of the faces to be assembled, for example enabling assembly of the two stressed basic structures by further molecular bonding.

The assembly of the two basic structures can therefore be effected by molecular adhesion, by bonding by means of an adhesive, or by bonding by means of a bedding layer.

An adhesion layer may be used between the preform and the structure to be deformed or electrostatic or magnetic forces may be used to hold the preform and the curved basic structure in contact.

Figure 9:
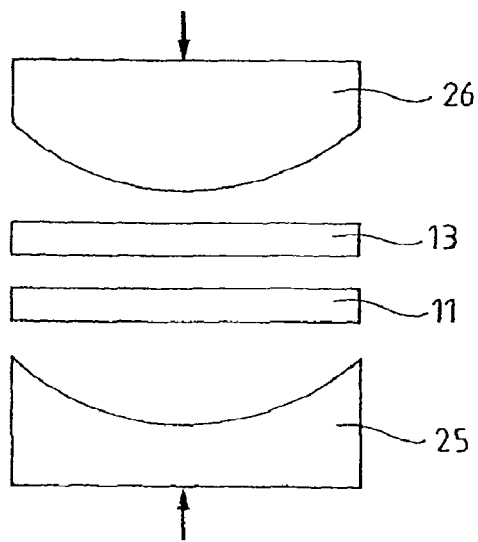

In a further variant, shown in FIG. 9, the two structures 11 and 13 are placed face to face without bonding them and are deformed simultaneously between a concave preform 25 and a convex preform 26 with complementary shapes. In FIG. 9 the arrows show the pressure forces to be applied to cause the deformation. The two structures are then deformed conjointly, a film of air remaining between the two structures. Once the required curvature has been achieved, the air film is evacuated and, because of the forces applied, bonding by molecular adhesion then takes place.

Figure 10A:
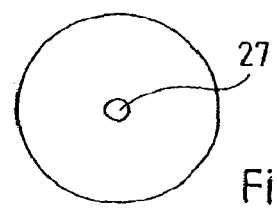
FIGS. 10A and 10B show from above two examples of producing one of the structures to be assembled in such a way as to prevent trapping air bubbles.

When the second structure 13 is deformed between the first structure 11 and the preform 14, an air bubble may be trapped between the two structures and impede bonding by molecular adhesion. To evacuate this air bubble, it is advantageous to pierce one or both of the structures to be assembled at their center 27, as shown in FIG. 10A, for example by laser drilling or deep etching of the structure.

Figure 10B:
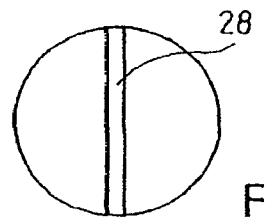

An alternative is to provide on one or both 30 structures one or more evacuation channels 28 on the face to be assembled and discharging at the edge of the wafer, as shown in FIG. 10B. For example, these channels may have dimensions of the order of a width of 100 μm and a depth of 5 μm and be produced by the usual lithography and etching techniques. Aspiration means could be associated with these channels 28 or the piercing 27 to facilitate evacuation of the trapped air.

Another option may be to effect the deformation and the assembly under a partial vacuum in order to minimize the volume of trapped air, although this method has the drawback of necessitating much harder vacuums to ensure deformation of the structures.

A final option entails placing radial spacers at the wafer periphery and removing them once the central area has been bonded. More generally, any method may be used that enables initiation of bonding between the two structures at their center which then propagates toward the edges. For example, a slight difference in radius of curvature between the two structures could be introduced before bonding to achieve this.

After bonding by the method of the invention, there is obtained, by imposing a tangential stress difference between the phases of the two structures to be assembled, a stressed complex structure in which the stresses at all points are known. When the forces that deformed the two initial structures (mechanical pressure or aspiration by means of a vacuum) are removed, upon the release of the exterior faces of the complex structure, the stresses within that structure evolve, but in a particular manner that is known to the person skilled in the art. Among other things, this evolution is a function of the natures and the thicknesses of the various materials constituting each of the two initial structures and the stress difference at the bonding interface.

Figure 3B:

The methods described above enable dissociation under controlled stresses of a heterostructure formed of substrates of different materials (for example, as illustrated in FIG. 3B). These substrates may be thicker or thinner, of simple or composite form (formed of a stack of different layers of thicker or thinner materials), processed or not. The materials concerned are all the semiconductors, such as in particular silicon, germanium, their alloys ($Si_{1-x}Ge_x$), indium phosphide (InP), gallium arsenide (GaAs), lithium niobate, silicon carbide (SiC), gallium nitride (CaN), sapphire, superconductors such as compositions of the YbaCuQ, NbN, or BiSrCaCuQ type, for example, or insulators such as, in particular, fused silica, quartz, glasses with different compositions, MgQ, all metals such as in particular tungsten, copper or aluminum.

Diverse variants of the foregoing are feasible. The preforms may be heated to enable hot bonding of deformed intermediate structures. The preforms may advantageously be at different temperatures so that the two intermediate structures have a temperature difference at the moment of assembly.

Bonding the intermediate structures at high temperature also provides control over the internal stresses of the complex structure, in addition to the control already achieved through the controlled deformation of the intermediate structures.

For example, it is then possible to cancel the internal stresses of a complex structure at a given temperature by limiting the deformation of the intermediate structures. For example, it is not wished to deform to a radius of curvature of more than 1.4 m the two intermediate structures consisting of a 750 μm thick silicon wafer 200 mm in diameter and a 1200 μm thick fused silica wafer 200 mm in diameter. These two intermediate structures, deformed to a radius of curvature of approximately 1.4 m 30 prior to bonding, yield a complex structure in which the internal stresses are eliminated at approximately 300° C. if bonding took place at 20° C. On the other hand, if the two intermediate structures are bonded at 100° C., the internal stresses of the complex structure are eliminated at 380° C., and thus at a higher temperature without having to deform further the intermediate structures.

A layer that flows at a certain temperature Tf may be placed between the two intermediate structures. Introducing this flow layer modifies the internal stresses in the complex structure if the heat treatment temperature exceeds Tf.

This minimizes stresses during annealing, for example. Consider, by way of example, a complex structure consisting of a 1200 μm thick fused silica substrate of 200 mm diameter on which there is a 0.4 μm thick film of silicon. Creating the complex structure by means of the invention means that a heat treatment temperature Ttth of 800° C., for example, can be achieved without exceeding the stress level set to preserve good crystal quality in the silicon film (without prestressing the basic structures to form the complex structure, a temperature of 800° C. could not be reached without degrading the silicon film). On the other hand, if it is required to raise the heat treatment temperature without modifying the deformation of the basic structures used to obtain the complex structure, there is then the risk of exceeding the stress level that has been set. If there is a layer that flows at Tf, with Tf equal to 800° C., for example, as soon as the heat treatment temperature exceeds Tf the flow layer will flow, thereby relieving some of the internal stresses. Heat treatment can then be carried out at a temperature higher than Ttth without exceeding the internal stress level that has been set.

The preforms may be molds, for example porous 30 molds.

Figure 11:
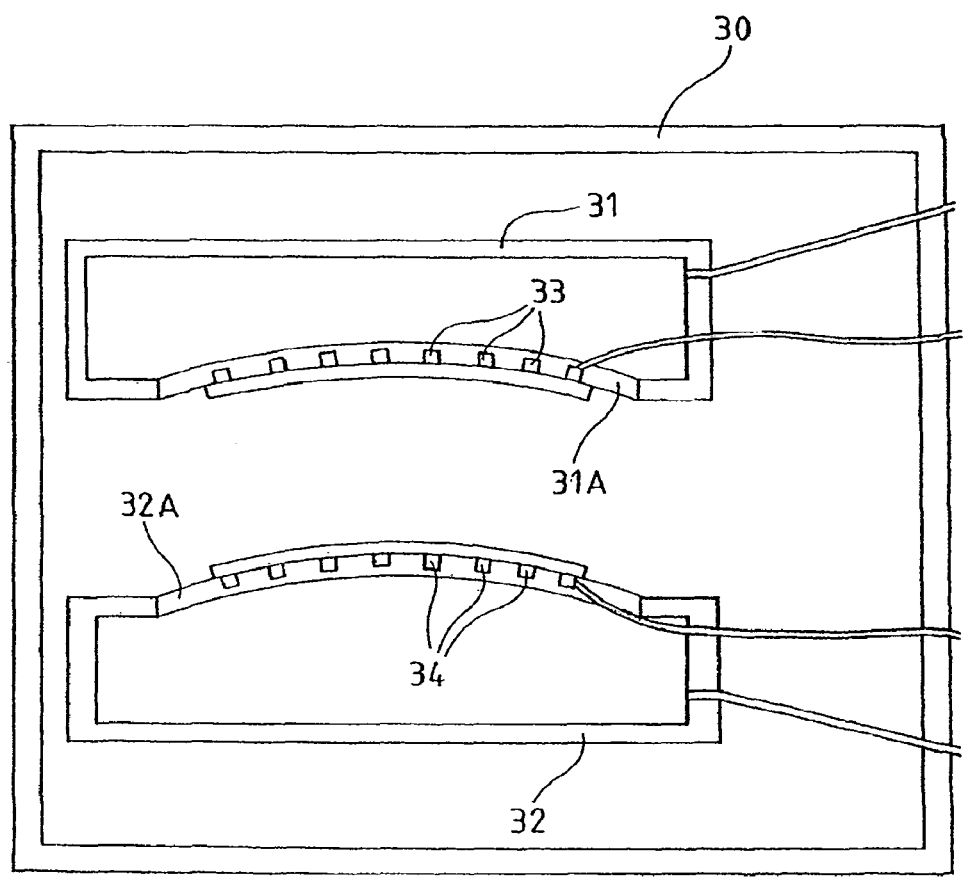
FIG. 11 is a diagrammatic view in section of a pair of deformable preforms.

If a pressure difference is used to deform the basic structures or to retain the basic structures on the preforms, it can be advantageous for one of the faces of the basic structures to be at a pressure other than atmospheric pressure, advantageously a pressure higher than atmospheric pressure. FIG. 11 shows by way of example an enclosure 30 containing two preforms 31 and 32 each including a deformable membrane 31A or 32A. Aspiration channels 33 and 34 open onto the surface of these membranes, and are represented here as being tangential. The aspiration or pressurization circuits are represented by double lines.

The aspiration channels maintain the basic structures in their deformed state; the area of the aspiration channels may be limited by subjecting the exposed face of the intermediate structure to a pressure higher than atmospheric pressure (for example a pressure inside the enclosure of 2 bar) Moreover, if the deformable preform is deformed by a pressure difference, a greater deformation can be achieved by increasing the pressure on the exposed face of the basic structure. For example, the preform 31 is at an internal pressure of 1.5 bar, the channels 33 are at a pressure of 0.3 bar, the preform 32 is at an internal pressure of 2.5 bar, and the channels 34 are at a pressure of 0.3 bar. The pressure of the enclosure (2 bar) is between the pressures of the preforms 31 and 32.

The invention claimed is:

1. A method for transferring a thin layer from a source substrate to a target substrate comprising the following steps:

ionically implanting the source substrate through a face thereof to create a buried weakened layer at a particular depth relative to the face of the source substrate, a thin layer thereby being delimited between the face and the buried weakened layer;

curving each of the source substrate and the target substrate by applying force with a mechanical device to create a tangential stress state difference between the face of the source substrate and a face of the target substrate;

after curving each of the source substrate and the target substrate, assembling the face of the source substrate to the face of the target substrate to form an assembled structure, then removing the mechanical device to remove the force that curves each of the source substrate and the target substrate; and dissociating the thin layer from a remainder of the source substrate after removing the mechanical device, wherein the tangential stress state difference is selected to produce a predetermined stress state within the assembled structure at the moment of dissociation.

2. The method according to claim 1, wherein creating a tangential stress state difference between the faces comprises creating a tangential stress state difference to minimize internal stresses at the moment of dissociation.

3. The method according to claim 1, wherein the tangential stress state difference between the faces is selected to minimize the stresses in the separation region at the moment of dissociation.

4. The method according to claim 1 further comprising curving the source and target substrates so that the faces comprise respectively concave and convex faces.

5. The method according to claim 4, wherein curving the source and target substrates comprises curving so that the faces comprise complementary faces.

6. The method according to claim 5, wherein curving the source and target substrates comprises curving so that the faces comprise respectively spherical concave and spherical convex faces.

7. The method according to claim 1, wherein curving each of the source substrate and the target substrate comprises applying mechanical forces with an external mechanical device to create a pressure difference between the faces of the source substrate and the target substrate.

8. The method according to claim 7, wherein creating a pressure difference between the faces comprises aspirating one of the source substrate or the target substrate onto a concave preform having a suitable profile and imparting the profile to a face of the one substrate, and wherein the one substrate rests on the concave preform at its periphery.

9. The method according to claim 7, wherein creating the pressure difference between the faces comprises aspirating one of the source substrate or the target substrate into a cavity, the one substrate resting locally at its periphery on a seal bordering the cavity.

10. The method according to claim 7, wherein applying forces with an external device comprises deforming one of the source substrate or the target substrate between complementary first and second preforms, one of which is concave and the other of which is convex, and imparting selected profiles to the face of the one substrate.

11. The method according to claim 10, wherein the first complementary preform comprises the other of the first or second preforms, and wherein the one substrate is curved to have a selected profile.

12. The method according to claim 10, wherein the second preform includes aspiration channels for keeping the one substrate curved when the first preform has been removed.

13. The method according to claim 7, wherein applying forces with an external device comprises applying mechanical forces simultaneously to the source and target substrates by deforming the source and target substrates between two preforms having selected profiles to be imparted to the faces of the source and target substrates.

14. The method according to claim 7, wherein applying forces with an external device comprises applying mechanical forces to at least one of the source substrate or the target substrate by means of a preform comprising a mold.

15. The method according to claim 14, wherein the preform comprises a porous mold.

16. The method according to claim 7, wherein applying forces with a mechanical device comprises applying mechanical forces to the source and target substrates using at least one deformable preform.

17. The method according to claim 1, wherein assembling the source and target substrates comprises molecular bonding.

18. The method according to claim 17 further comprising treating the connecting faces of source and target substrates to facilitate bonding.

19. The method according to claim 1, wherein the source and target substrates are assembled by direct contact, wherein the face of at least one of the source substrate or the target substrate is adapted to prevent air from being trapped between the faces of the source and target substrates.

20. The method according to claim 19 further comprising piercing at least one of the source substrate or the target substrate.

21. The method according to claim 20, wherein piercing at least one of the source substrate or the target substrate comprises piercing the one substrate at its center.

22. The method according to claim 19 further comprising forming in at least one of the source substrate or the target substrate at least one dead-end channel discharging at the edge of the substrate.

23. The method according to claim 1, wherein the source and target substrates are assembled by means of a flow layer.

24. The method according to claim 1, wherein the source and target substrates are assembled at a temperature higher than room temperature.

25. The method according to claim 24 further comprising heating the source and target substrates by contact with heated preforms.

26. A method according to claim 25, wherein the preforms are heated to respective different temperatures.

* * * * *